(12) United States Patent
Tashiro

(10) Patent No.: US 10,141,367 B2
(45) Date of Patent: Nov. 27, 2018

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventor: Kazuaki Tashiro, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/809,899

(22) Filed: Nov. 10, 2017

(65) Prior Publication Data

US 2018/0151620 A1  May 31, 2018

(30) Foreign Application Priority Data

Nov. 30, 2016  (JP) .................. 2016-233213

(51) Int. Cl.

| | | |
|---|---|---|
| *H04N 3/14* | (2006.01) | |
| *H04N 5/335* | (2011.01) | |
| *H01L 27/146* | (2006.01) | |
| *H04N 5/3745* | (2011.01) | |
| *H04N 5/378* | (2011.01) | |
| *H01L 31/0376* | (2006.01) | |

(52) U.S. Cl.
CPC ....... *H01L 27/14667* (2013.01); *H04N 5/378* (2013.01); *H04N 5/37457* (2013.01); *H01L 27/14621* (2013.01); *H01L 27/14627* (2013.01); *H01L 27/14636* (2013.01); *H01L 31/03762* (2013.01)

(58) Field of Classification Search
CPC ......... H01L 27/14667; H01L 27/14603; H01L 27/14643; H01L 27/14621; H01L 27/14636; H04N 5/37457; H04N 5/378; H04N 5/374; H04N 5/376
See application file for complete search history.

(56) References Cited

U.S. PATENT DOCUMENTS

| | | | |
|---|---|---|---|
| 2007/0272828 A1* | 11/2007 | Xu | H04N 5/361 |
| | | | 250/208.1 |
| 2016/0150174 A1* | 5/2016 | Hynecek | H04N 5/37457 |
| | | | 348/308 |
| 2016/0380025 A1* | 12/2016 | Rothberg | G01N 21/6408 |
| | | | 250/206 |
| 2017/0162617 A1* | 6/2017 | Takahashi | H01L 27/14605 |
| 2018/0090533 A1* | 3/2018 | Otake | H01L 27/14605 |

FOREIGN PATENT DOCUMENTS

| | | |
|---|---|---|
| JP | 2016-39580 A | 3/2016 |
| JP | 2016-86407 A | 5/2016 |
| WO | 10/116974 A1 | 10/2010 |

* cited by examiner

*Primary Examiner* — Kelly L Jerabek
(74) *Attorney, Agent, or Firm* — Canon U.S.A., Inc. IP Division

(57) ABSTRACT

A photoelectric conversion apparatus includes a plurality of pixels including a pixel electrode having a first electrode and a second electrode, an upper electrode, a photoelectric conversion layer, a first signal output circuit, and a second signal output circuit, and a control unit. During a first period in which the first signal output circuit outputs a signal, the second electrode collects signal charges.

20 Claims, 22 Drawing Sheets

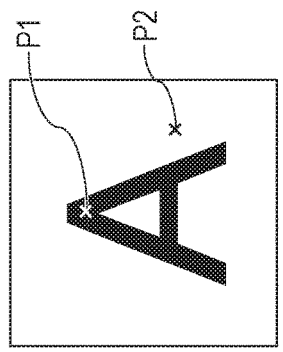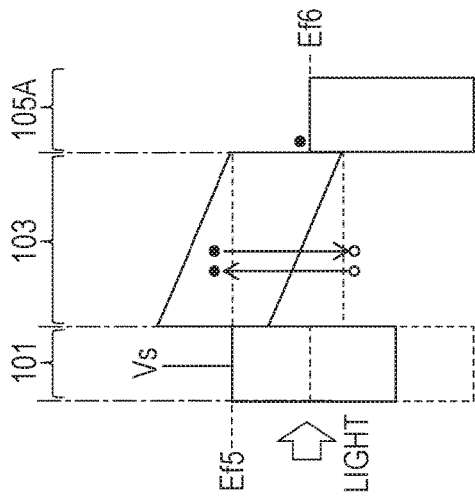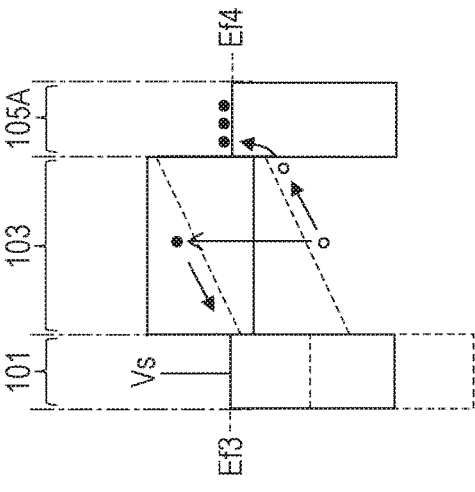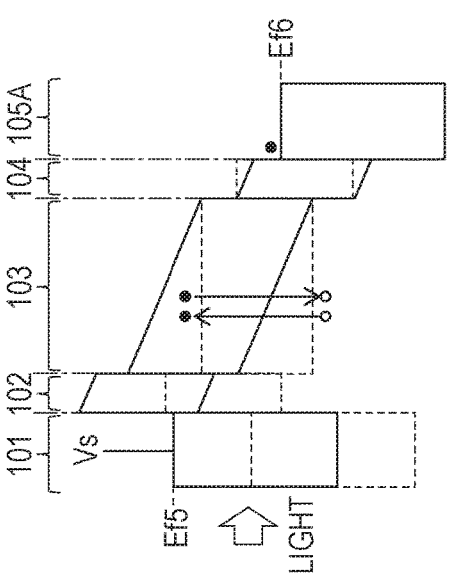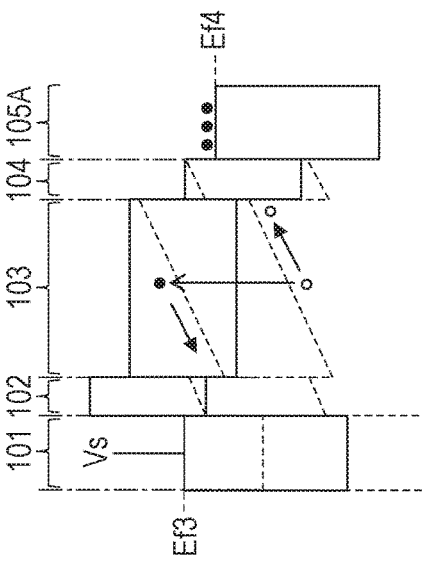

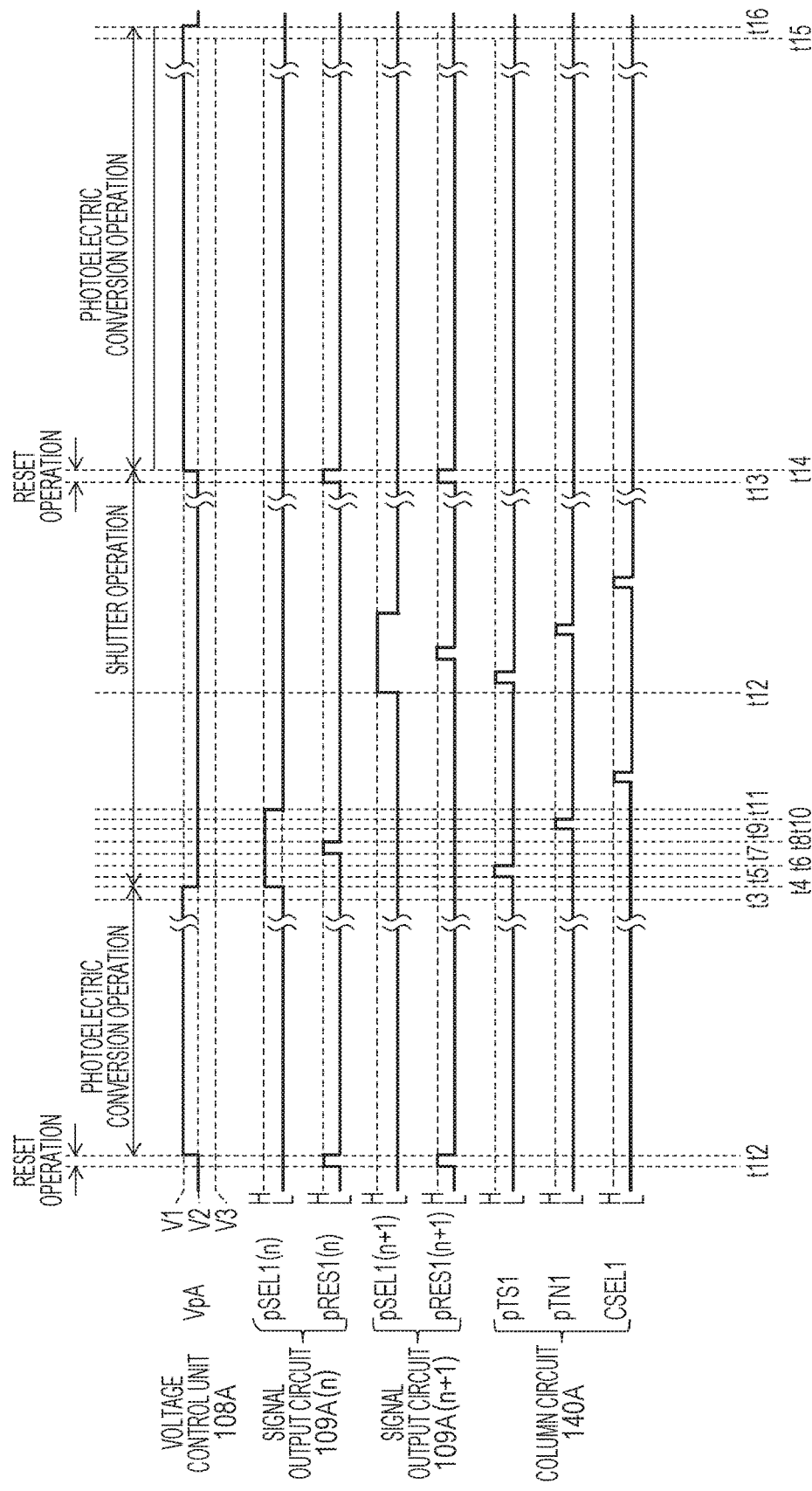

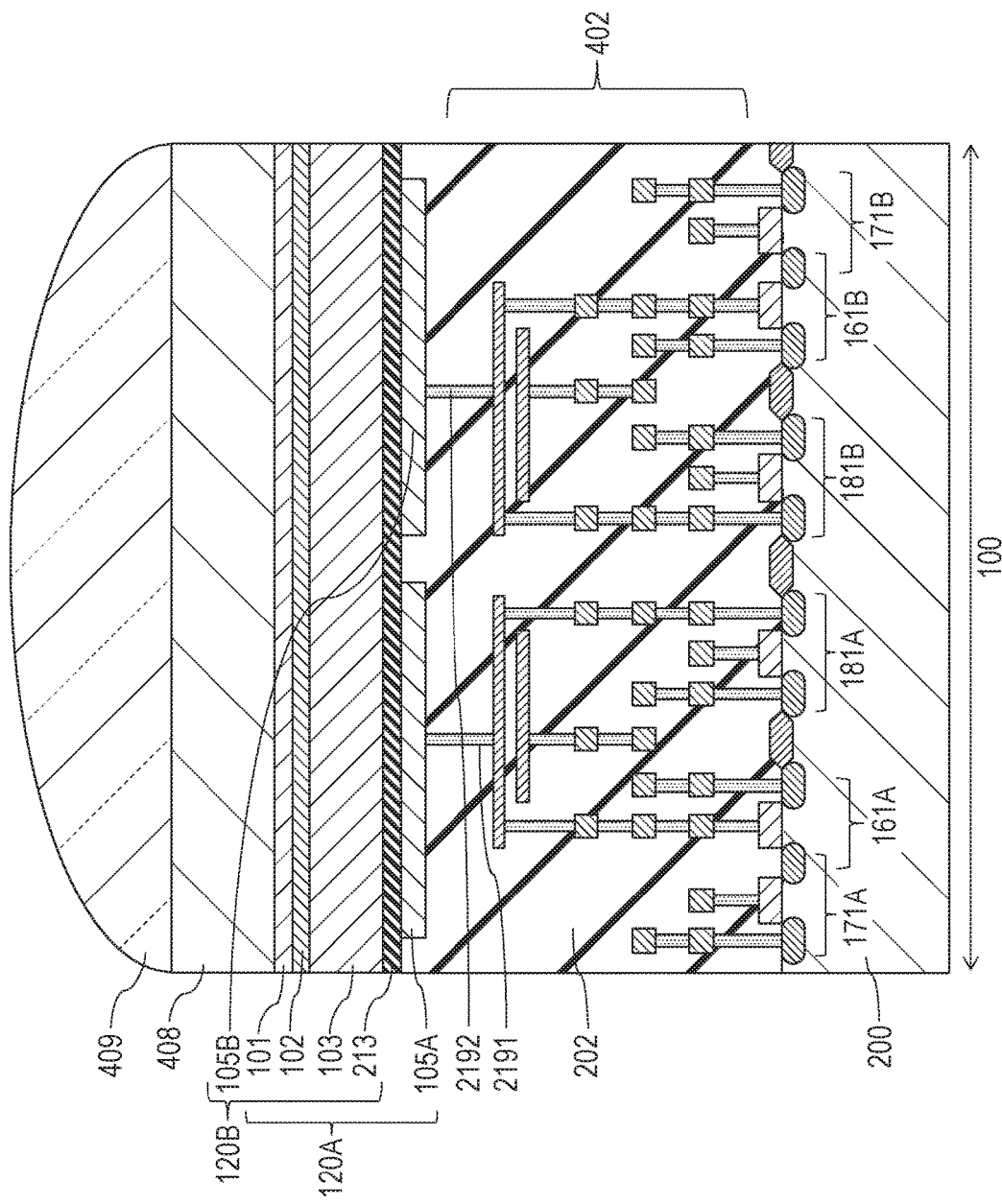

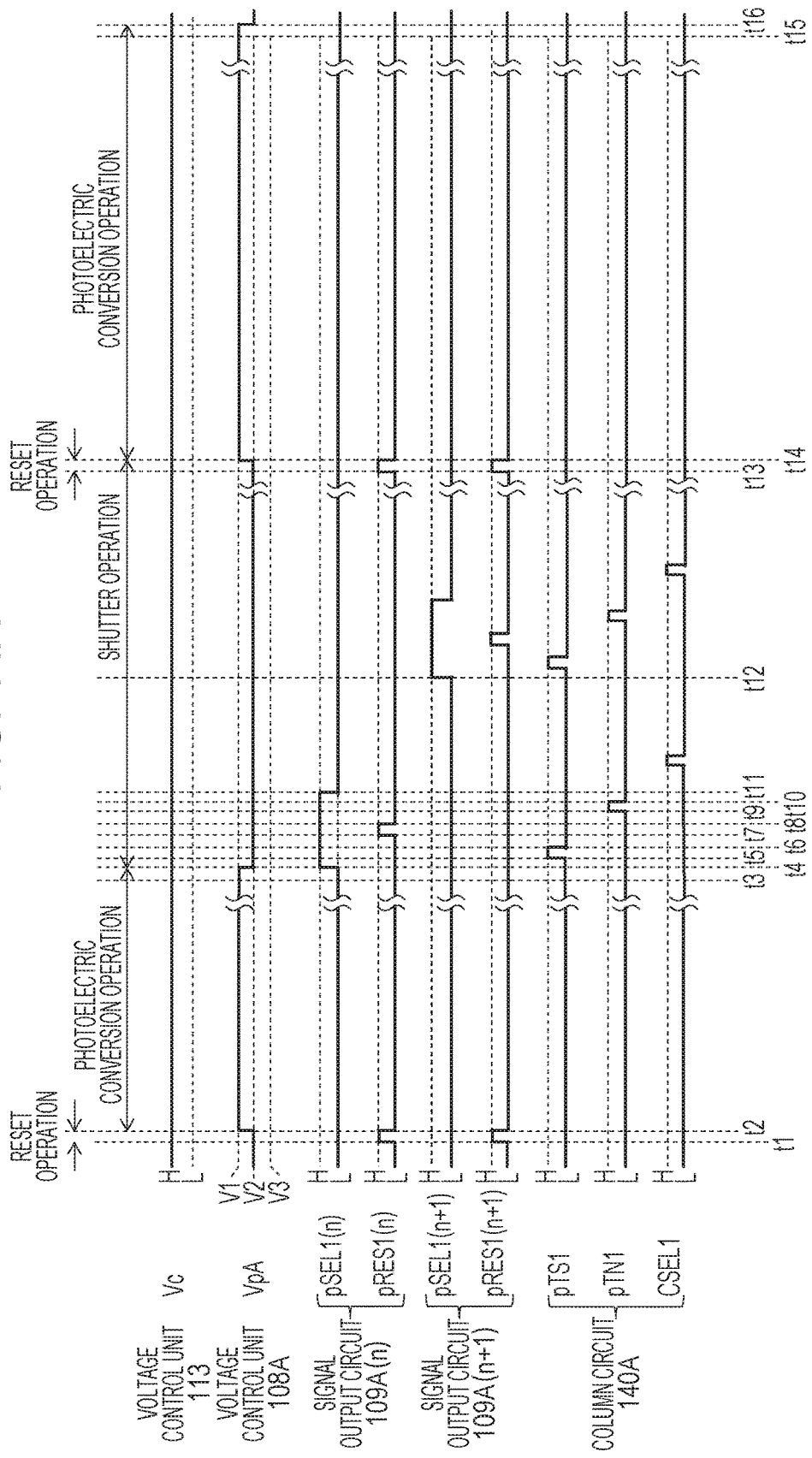

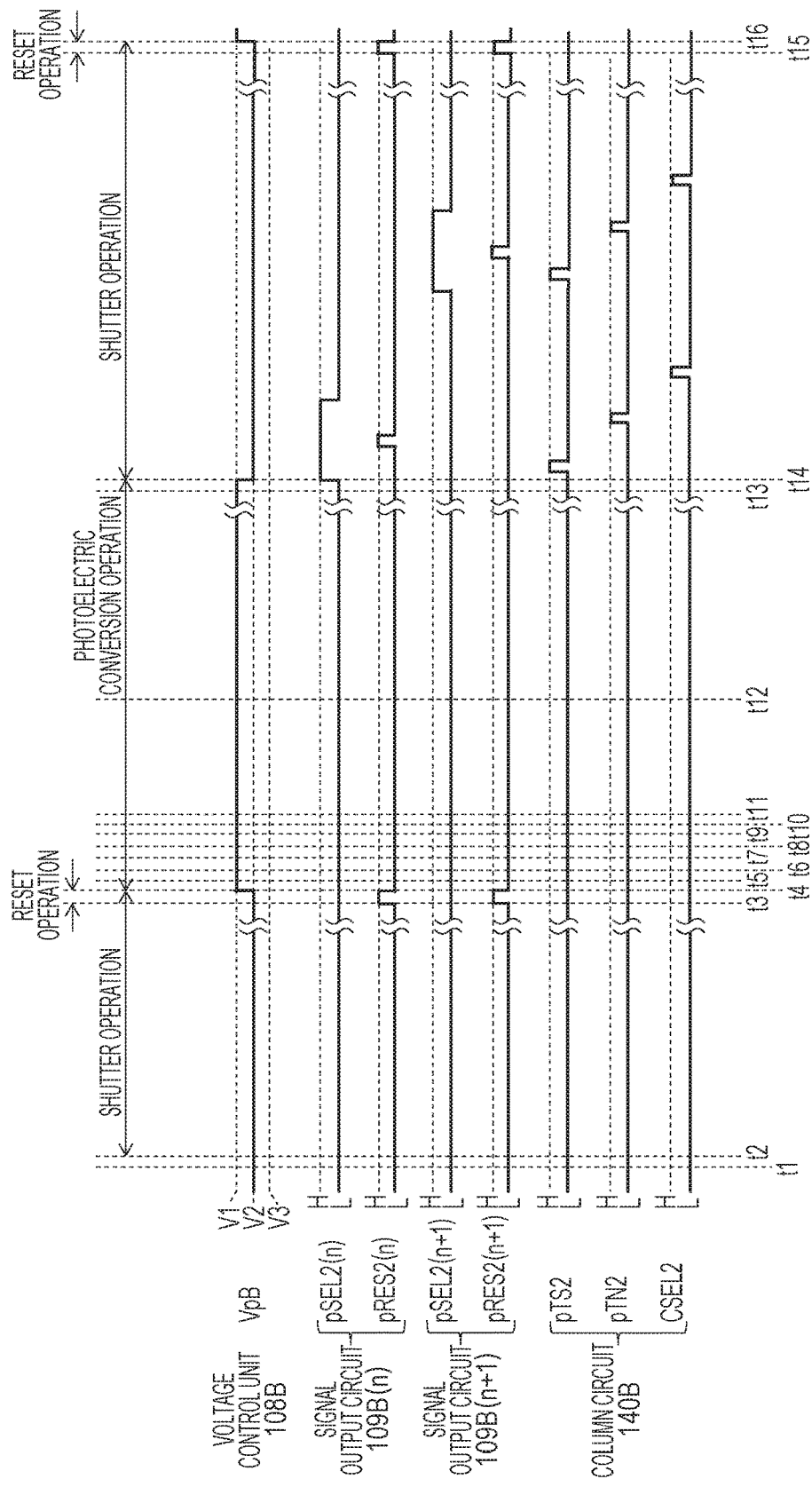

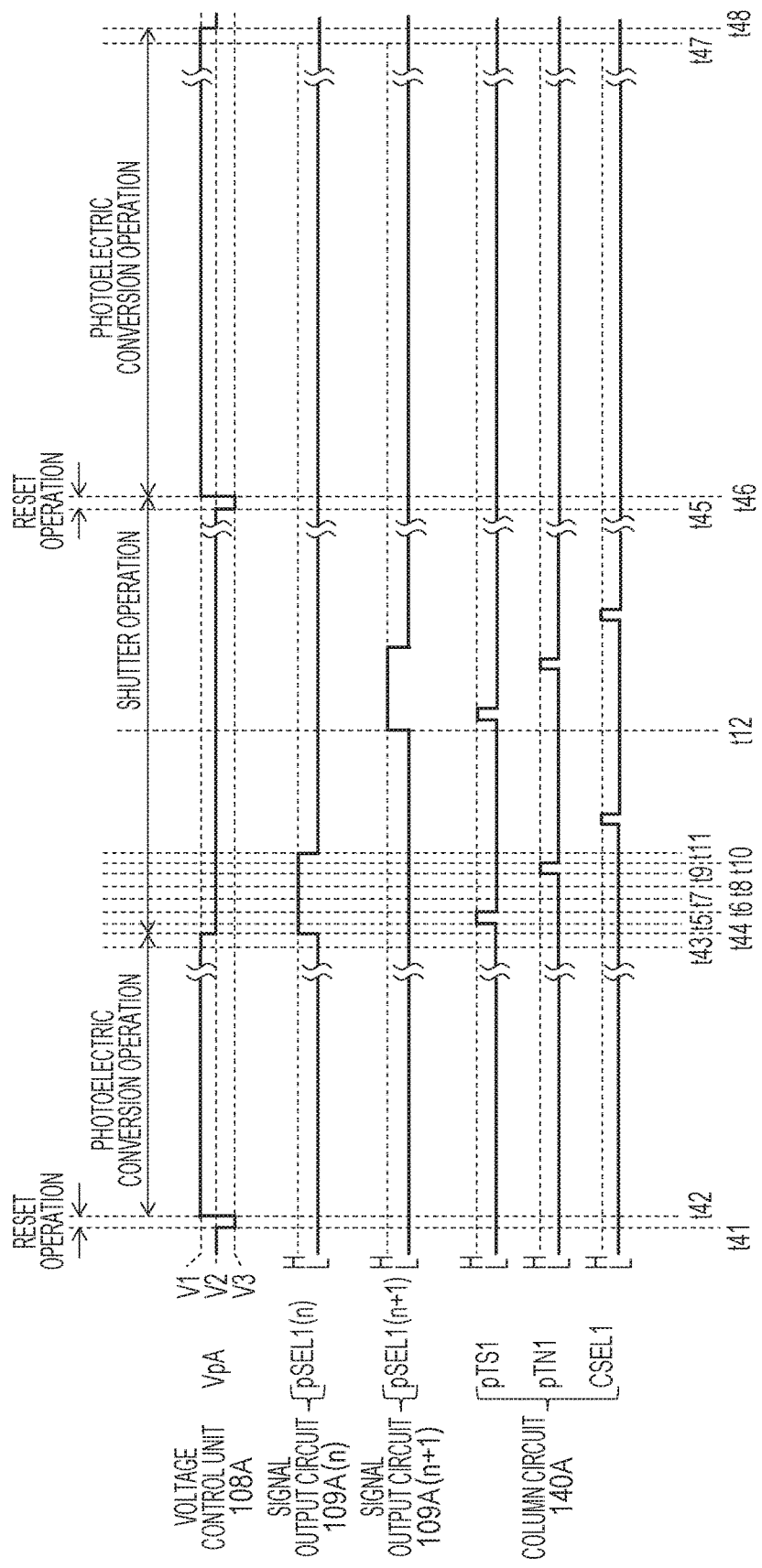

PHOTOELECTRIC CONVERSION APPARATUS AND PHOTOELECTRIC CONVERSION SYSTEM

BACKGROUND OF THE INVENTION

Field of the Invention

The aspect of the embodiments relates to a photoelectric conversion apparatus including a photoelectric conversion layer formed on a substrate and a photoelectric conversion system.

Description of the Related Art

A configuration of a photoelectric conversion apparatus including a photoelectric conversion unit in which a photoelectric conversion layer is formed on a semiconductor substrate and a pixel that is arranged on the semiconductor substrate and includes a signal output unit connected to the photoelectric conversion unit has been proposed. Japanese Patent Laid-Open No. 2016-86407 describes a configuration where an upper electrode is arranged on the photoelectric conversion layer, a pixel electrode and an auxiliary electrode are arranged under the photoelectric conversion layer, and an electric potential supplied to the auxiliary electrode is controlled to adjust a sensitivity of the photoelectric conversion layer.

SUMMARY OF THE INVENTION

According to an aspect of the embodiments, there is provided a photoelectric conversion apparatus including: a plurality of pixels, each pixel including a pixel electrode having a first electrode and a second electrode on an upper part of a substrate, an upper electrode arranged on an upper part of the pixel electrode, a photoelectric conversion layer arranged between the pixel electrode and the upper electrode, a first signal output circuit including a first amplification unit having an input node directly connected to the first electrode, and a second signal output circuit including a second amplification unit having an input node directly connected to the second electrode; and a control unit configured to supply an electric potential to the second electrode that a potential of the second electrode with respect to signal charges decreases as compared with a potential of the first electrode with respect to signal charges in an electric potential supplied to the first electrode during a first period in which the first signal output circuit outputs a signal.

Further features of the disclosure will become apparent from the following description of exemplary embodiments with reference to the attached drawings.

BRIEF DESCRIPTION OF THE DRAWINGS

FIGS. 7A to 7E are potential characteristic charts of the photoelectric conversion unit arranged on the pixel.

FIGS. 8A and 8B are driving timing charts of the photoelectric conversion apparatus.

FIG. 10 is a cross-sectional schematic diagram of the pixel.

FIGS. 14A and 14B are driving timing charts of the photoelectric conversion apparatus.

FIGS. 16A and 16B are driving timing charts of the photoelectric conversion apparatus.

DESCRIPTION OF THE EMBODIMENTS

Figure 1:
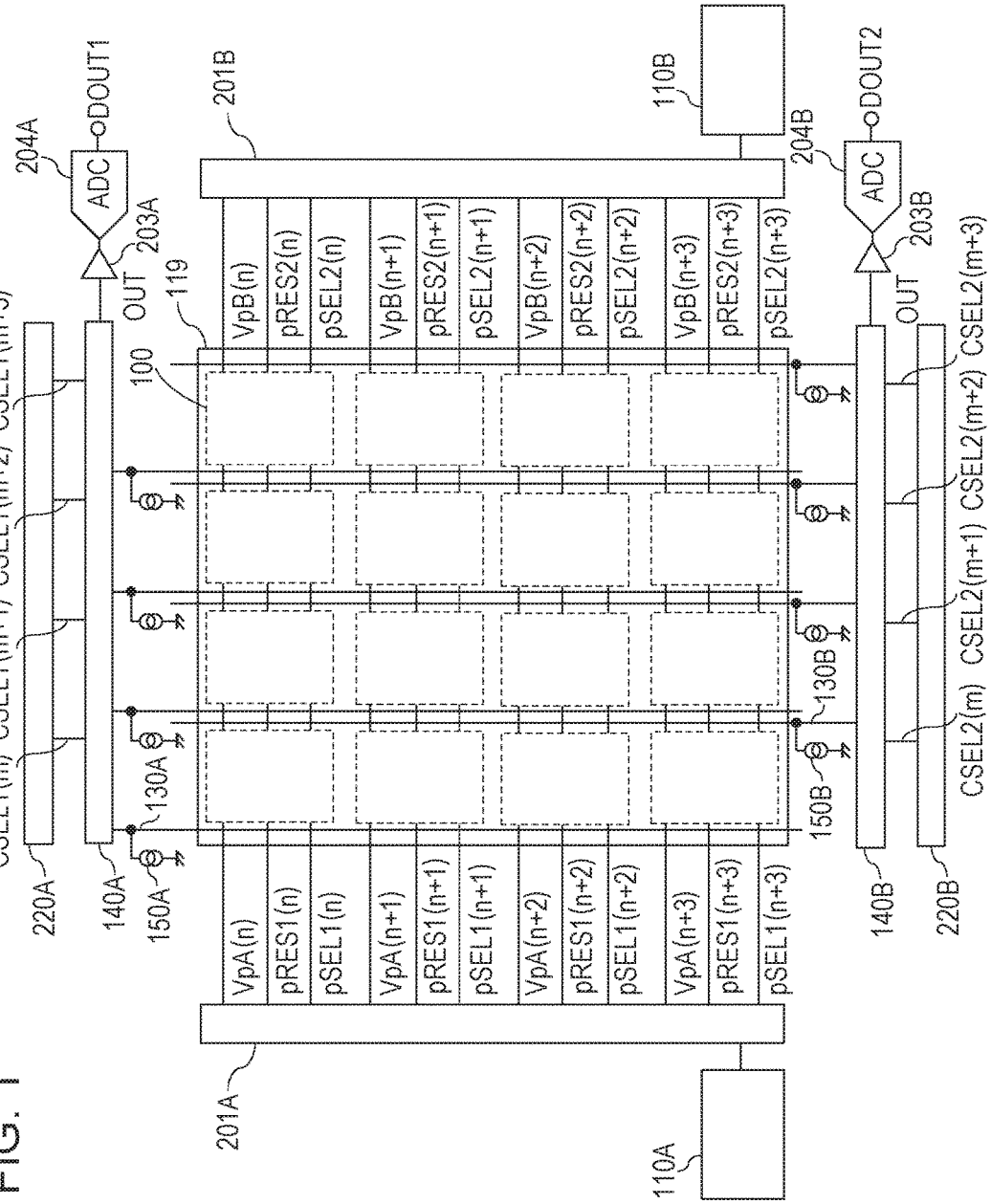
FIG. 1 is a block diagram of a photoelectric conversion apparatus.

A photoelectric conversion apparatus described in Japanese Patent Laid-Open No. 2016-86407 supplies such an electric potential to an auxiliary electrode that an area where signal charges are captured in a pixel electrode disappears during a period in which a signal is output from a pixel and realizes a state as if a photosensitive area is shielded from light. For this reason, an optical signal that may be generated on a photoelectric conversion layer is not used during the period in which the signal is output from the pixel.

In view of the above, according to an aspect of the embodiments, there is provided a photoelectric conversion apparatus that can use the optical signal generated on the photoelectric conversion layer during the period in which the signal is output from the pixel. An exemplary mode of the aspect of the embodiments relates to a photoelectric conversion apparatus including a plurality of pixels, each pixel including two photoelectric conversion units and signal output circuits corresponding to the respective photoelectric conversion units.

The two photoelectric conversion units commonly use a photoelectric conversion layer and an upper electrode, and each of the photoelectric conversion units has a different pixel electrode. In addition, the signal output circuits that correspond to the respective pixel electrodes and output a signal based on charges generated on the shared photoelectric conversion layer are provided. It should be noted that a direct connection between the pixel electrode and an input node in the present exemplary mode refers to a configuration where a transistor, a switch, or the like that switches an electric connection between the pixel electrode and the input node is not arranged.

The photoelectric conversion apparatus according to the present exemplary mode includes a substrate on which signal output circuits are arranged, two pixel electrodes (a first electrode and a second electrode) arranged so as to be adjacent to be each other on the substrate, an upper electrode arranged on an upper part of a pixel electrode, and a photoelectric conversion layer arranged so as to be sandwiched by the pixel electrode and the upper electrode. The signal output circuits (a first signal output circuit and a second signal output circuit) include an amplification unit that outputs a signal based on the charges generated on the photoelectric conversion layer. It should be noted that the first signal output circuit includes a first amplification unit including an input node directly connected to the first electrode, and the second signal output circuit includes a second amplification unit including an input node directly connected to the second electrode.

According to the above-described configuration, when the first electrode collects charges generated by the photoelectric conversion unit during a period in which a signal is output from the first signal output circuit, there is a risk that an electric potential of the input node of the first amplification unit may change. In view of the above, the second electrode collects the charges during a first period in which the signal is output from the first signal output circuit in the photoelectric conversion apparatus according to the present exemplary mode. At this time, such an electric potential is supplied to the second electrode that a potential of the second electrode with respect to the signal charges decreases as compared with a potential of the first electrode with respect to signal charges in an electric potential supplied to the first electrode.

When the above-described configuration is adopted, the second electrode can collect charges generated on a photoelectric conversion film during the first period in which the signal is output from the first signal output circuit, and the signal charges generated on the photoelectric conversion layer can be used during a period in which a signal is output from a signal output circuit 109A.

Similarly, when the second electrode collects the charges generated by the photoelectric conversion unit during a period in which a signal is output from the second signal output circuit, there is a risk that an electric potential of an input node of the second amplification unit may change. In view of the above, the first electrode collects the charges during a second period in which a signal based on the charges collected by the second electrode is output from the second signal output circuit in the photoelectric conversion apparatus according to the present exemplary mode. At this time, such an electric potential is supplied to the first electrode that the potential of the first electrode with respect to the signals charges decreases as compared with the potential of the second electrode with respect to the signal charges in the electric potential supplied to the second electrode.

When the above-described configuration is adopted, the first electrode can collect the charges generated on the photoelectric conversion film during the second period in which the signal is output from the second signal output circuit, and an optical signal generated on the photoelectric conversion layer can be used during a period in which a signal is output from a signal output circuit 109B.

In a case where the first period and the second period are alternately implemented, a complete global shutter can be realized.

The photoelectric conversion apparatus according to the present exemplary mode can use the signal charges generated on the photoelectric conversion layer during the period in which the signal is output from the pixel.

Hereinafter, exemplary embodiments of the disclosure will be described in detail with reference to the drawings. The disclosure is not limited to the exemplary embodiments described below. A modified example where part of a configuration of an exemplary embodiment described below is modified within the gist of the disclosure is also an exemplary embodiment of the disclosure. In addition, an example where part of a configuration of one of the following exemplary embodiments is added to another exemplary embodiment or an example where part is replaced by part of a configuration of another exemplary embodiment is also an exemplary embodiment of the disclosure.

First Exemplary Embodiment

The photoelectric conversion apparatus according to the present exemplary embodiment will be described with reference to FIG. 1 to FIGS. 8A and 8B. Parts assigned with the same reference symbols in the respective drawings refer to the same elements or the same areas. In FIG. 1, to distinguish drive pulses supplied to different rows from one another, reference symbols indicating respective rows such as (n) and (n+1) are assigned. In addition, to distinguish drive pulses supplied to different columns from one another, reference symbols indicating respective columns are assigned. The same also applies to the other drawings.

FIG. 1 is a block diagram illustrating a configuration example of a photoelectric conversion apparatus. The photoelectric conversion apparatus includes a pixel array 119, a row drive circuit 201A, a row drive circuit 201B, a signal line 130A, a signal line 130B, a current source 150A, and a current source 150B. Furthermore, the photoelectric conversion apparatus includes a column circuit 140A, a column drive circuit 220A, a column circuit 140B, a column drive circuit 220B, an output amplifier unit 203A, an output amplifier unit 203B, an analog-to-digital conversion unit 204A, and an analog-to-digital conversion unit 204B.

A plurality of pixels 100 are two-dimensionally arranged in the pixel array 119. FIG. 1 illustrates a case where the pixels 100 in 4 rows×4 columns are arranged, but the number of pixels 100, the number of rows, and the number of columns are not limited to the above-described configurations. The pixels 100 illustrated in FIG. 1 include a path through which a signal is output via the signal line 130A to the column circuit 140A and a path through which a signal is output via the signal line 130B to the column circuit 140B. Since the respective paths have the same configuration, hereinafter, only the path through which the signal is output via the signal line 130A to the column circuit 140A will be described.

It should be noted that a drive pulse supplied to the column circuit 140A and the signal output circuit 109A which will be described below is assigned with "1", and a drive pulse supplied to the column circuit 140B and the signal output circuit 109B which will be described below is assigned with "2". For example, in a case where "pRES1" is described, it indicates an electric potential supplied to a reset transistor 181A included in the signal output circuit 109A. On the other hand, for example, in a case where "pRES2" is described, it indicates an electric potential supplied to a reset transistor 181B included in the signal output circuit 109B.

The row drive circuit 201A is a circuit configured to control the plurality of pixels 100 in units of row and includes, for example, a shift register and an address decoder. The row drive circuit 201A supplies an electrode drive voltage VpA, the reset signal pRES1, and a drive pulse pSEL1 to output a signal of a pixel electrode 105A which will be described below.

The plurality of pixels 100 included in one row are connected to common drive pulse lines. The drive pulse lines include a wiring for transmitting the reset signal pRES1 and a wiring for transmitting the drive pulse pSEL1.

The row drive circuit 201A functions as a control unit configured to control an electric potential of the pixel electrode which will be described below included in the pixel 100 via a drive capacitance which will be also described below.

The signal line 130A is connected to the column circuit 140A. The column drive circuit 220A drives the column circuit 140A. Specifically, the column drive circuit 220A drives the column circuit 140A column by column.

When the above-described configuration is adopted, signals output in parallel from the single pixel 100 via the signal line 130A can be sequentially output from an output terminal DOUT1 via the output amplifier unit 203A and the analog-to-digital conversion unit 204A.

It should be noted that the column drive circuit 220A includes a plurality of column signal output circuits, each of the column signal output circuits being arranged for each of the columns in the pixel array 119. The respective column signal output circuits may include a correlation double sampling circuit configured to reduce noise, an amplifier configured to amplify a signal, or the like.

Figure 2A:
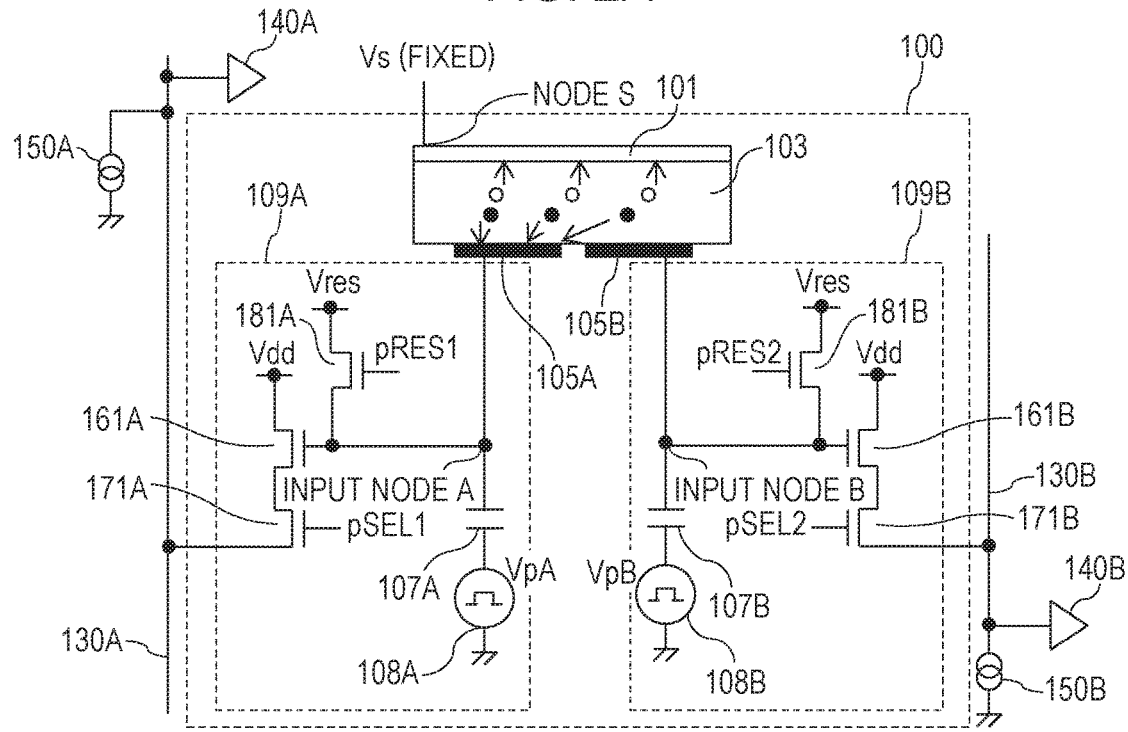
FIGS. 2A to 2C are equivalent circuit diagrams of a pixel arranged in the photoelectric conversion apparatus.
Figure 2B:
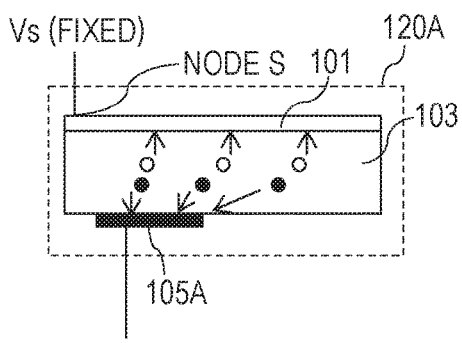
Figure 2C:
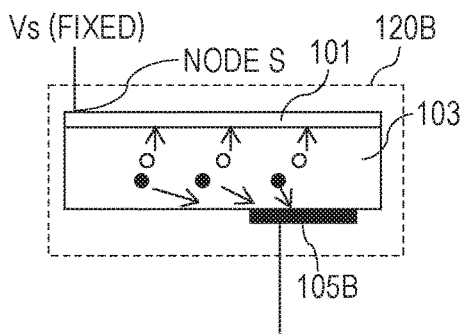

FIGS. 2A to 2C are equivalent circuit diagrams of the pixel arranged in the photoelectric conversion apparatus according to the first exemplary embodiment.

FIG. 2A illustrates the single pixel 100 as an example. As illustrated in FIG. 2A, the pixel 100 includes an upper electrode 101, a photoelectric conversion layer 103, the pixel electrode 105A (first electrode), a pixel electrode 105B (second electrode), the signal output circuit 109A (first signal output circuit), and the signal output circuit 109B (second signal output circuit). The signal output circuit 109A is connected to the column circuit 140A via the signal line 130A, and the signal output circuit 109B is connected to the column circuit 140B via the signal line 130B.

According to the present exemplary embodiment, a polarity of charges used as the signal charges among charge pairs generated in the photoelectric conversion layer 103 is set as a first conductivity type. Herein, the charges of the first conductivity type are set as electrons, and the respective transistors are described as N type transistors. It should be noted however that a configuration may also be adopted where holes are used the charges of the first conductivity type, and P type transistors are used as the transistors of the pixels.

The pixel electrode 105A and the pixel electrode 105B are arranged so as to be adjacent to each other on an upper part of a substrate. The pixel electrode 105A is directly connected to an input node A of an amplifier unit included in the signal output circuit 109A which will be described below. The pixel electrode 105B is directly connected to an input node B of an amplifier unit included in the signal output circuit 109B which will be described below.

The upper electrode is arranged on an upper part of the pixel electrode. A node S connected to the upper electrode 101 is connected to a power supply, and a fixed electric potential Vs (for example, 1.5 V) is supplied.

The photoelectric conversion layer 103 is arranged between the upper electrode 101 and the pixel electrode 105A and between the upper electrode 101 and the pixel electrode 105B.

As illustrated in FIG. 2B, a photoelectric conversion unit 120A includes the upper electrode 101, the photoelectric conversion layer 103, and the pixel electrode 105A. As illustrated in FIG. 2C, a photoelectric conversion unit 120B includes the upper electrode 101, the photoelectric conversion layer 103, and the pixel electrode 105B. The respective photoelectric conversion units 120 constitute photodiodes. According to the exemplary embodiment of the disclosure, it is characterized in that the photoelectric conversion unit 120A and the photoelectric conversion unit 120B commonly use the photoelectric conversion layer 103 in the same region as the upper electrode 101.

Next, the signal output circuit 109 will be described. Although only the signal output circuit 109A will be described hereinafter, the signal output circuit 109B also has a similar configuration.

The signal output circuit 109A includes the reset transistor 181A, a capacitance 107A, an electric potential control unit 108A, an amplification transistor 161A, and a selection transistor 171A. The amplification transistor 161 constitutes an amplification unit. Herein, the configuration including the amplification transistor 161 as the amplification unit has been illustrated but is not limited to this. For example, a source ground amplification circuit, an inverter circuit, a differential amplifier, or the like may be used.

A drain of the amplification transistor 161A is connected to a power supply voltage Vdd (for example, 3.3 V), and a source is electrically connected to the signal line 130A via the selection transistor 171A which will be described below. A gate of the amplification transistor 161A is connected to the input node A, and a signal based on electrons collected by the pixel electrode 105A is output. More specifically, the electrons moved from the photoelectric conversion layer 103 to the input node A are converted into an electric potential in accordance with the amount, and a signal in accordance with the electric potential is output to the signal line 130A via the amplification transistor 161A to be input to the column circuit 140A. The amplification transistor 161A constitutes a source follower circuit together with the current source 150A.

A power supply voltage Vres is connected to a drain of the reset transistor 181A, and a reset electric potential Vres (for example, 3.3 V that is the same as the power supply voltage Vdd) is supplied. A source of the reset transistor 181A is connected to the input node A, and a gate is supplied with a drive pulse pRES1, so that an on state and an off state of the reset transistor 181A are switched. The reset transistor 181A resets the electric potential of the input node A of the amplification transistor 161A.

The capacitance 107A is connected to the input node A and constitutes part of the input node. Furthermore, the capacitance 107A is connected to the electric potential control unit 108A. The electric potential control unit 108A supplies an electric potential VpA to the pixel electrode 105A via the capacitance 107A.

A drain of the selection transistor 171A is connected to the source of the amplification transistor 161A, and a source of the selection transistor 171A is connected to the signal line 130A. A gate of the selection transistor 171A is supplied with the drive pulse pSEL1, and an on state and an off state of the selection transistor 171A are switched.

The selection transistor 171A outputs the signals of the plurality of pixels arranged with respect to the single signal line 130A by one pixel each or plural pixels each. The source of the selection transistor 171A is connected to the current source 150A. It should be noted however that the selection transistor 171A may be arranged between the amplification transistor 161A and a power supply wiring where the power supply voltage Vdd is supplied instead of the configuration according to the present exemplary embodiment. In either case, the selection transistor 171A controls the electric connection between the amplification transistor 161A and the column circuit 140A via the signal line 130A. The capacitance 107A, the electric potential control unit 108A, a capacitance 107B, and the electric potential control unit 108B constitute a control unit configured to control the electric potential of the pixel electrode 105A and the pixel electrode 105B.

Figure 3:
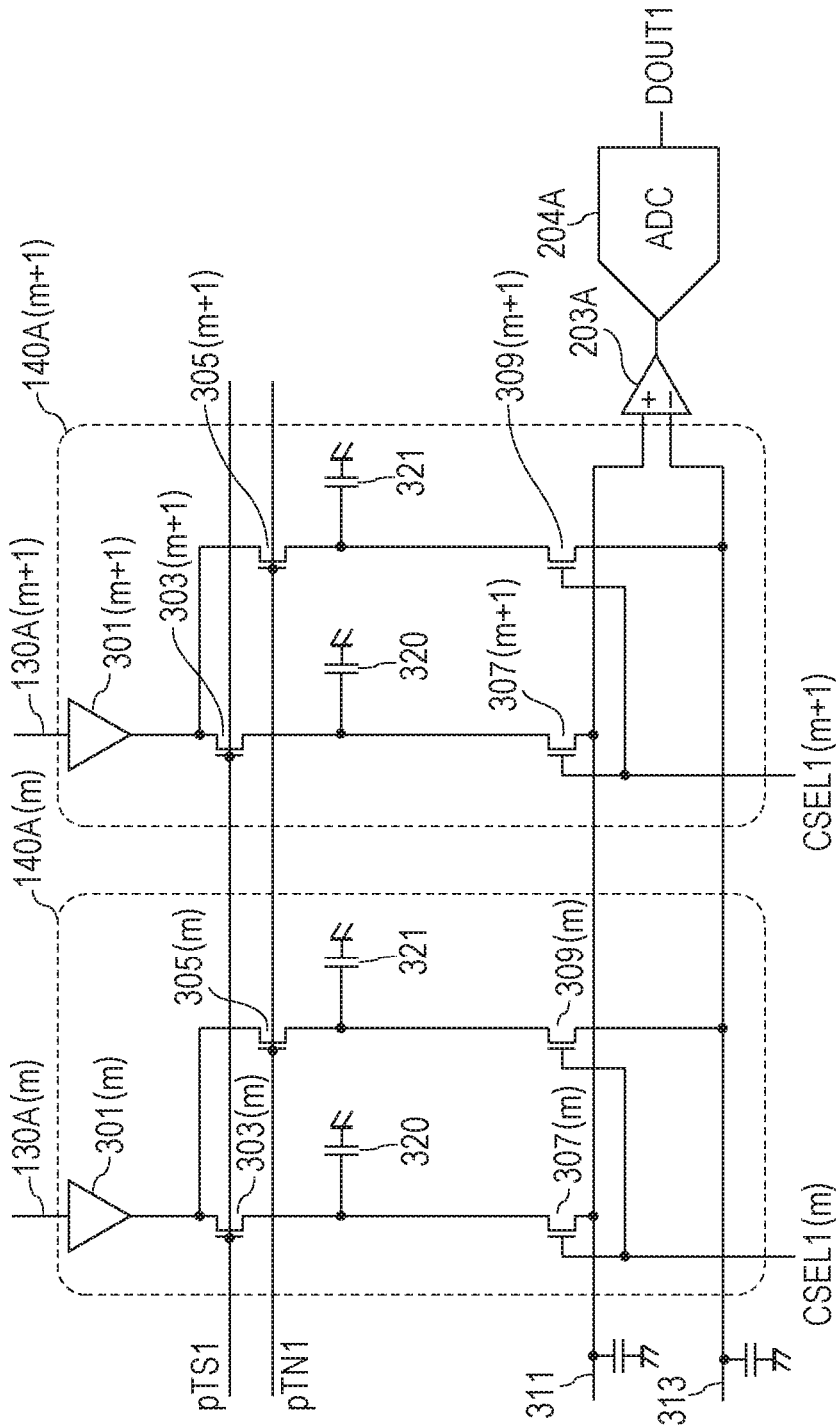
FIG. 3 is an equivalent circuit diagram of a column circuit.

Next, a configuration of the column circuit 140 will be described in detail with reference to FIG. 3. FIG. 3 illustrates an equivalent circuit of the column circuit 140A that outputs a signal from the pixel electrode 105A in the m-th column and the (m+1)-th column. Herein, a configuration of the column circuit 140B that outputs a signal from the pixel electrode 105B is similar to the configuration and operation of the column circuit 140A although not illustrated in the drawing. Hereinafter, the column circuit 140A in the m-th column will be described. It should be noted that a drive pulse supplied to the column circuit 140A is assigned with "1", and a drive pulse supplied to the column circuit 140B is assigned with "2" although not illustrated in the drawing here.

A signal input via the signal line 130A is amplified by a column amplifier 301. An output node of the column amplifier 301 is connected to a capacitance 320 via an S/H switch 303 and also connected to a capacitance 321 via an S/H switch 305.

The S/H switch 303 is driven by a drive pulse pTS1, and the S/H switch 305 is driven by a drive pulse pTN1. According to the above-described configuration, when the S/H switch 305 is put into an on state and the S/H switch 303 is put into an off state, a signal N including a threshold variation of the amplification transistor 161 from the pixel 100 can be held in the capacitance 321. When the S/H switch 303 is put into an on state and the S/H switch 305 is put into an off state, a signal S+N including an optical signal and a threshold variation can be held in the capacitance 320.

Therefore, the photoelectric conversion apparatus can perform correlation double sampling by using the signal held in the capacitance 320 and the signal held in the capacitance 321, and a signal obtained by reducing the signal N (noise signal) from the signal S+N can be read out.

The capacitance 320 is connected to an output line 311 via a transfer switch 307. The capacitance 321 is connected to an output line 313 via a transfer switch 309. The transfer switch 307 and the transfer switch 309 are controlled by a drive pulse CSEL1 supplied from the column drive circuit 220A.

The output amplifier unit 203A amplifies a difference signal between a signal input via the output line 311 and a signal input via the output line 313 and outputs the amplified signal. The amplified signal is input to the analog-to-digital conversion unit 204A and converted from an analog signal to a digital signal to be output to the outside of the photoelectric conversion apparatus via the output terminal DOUT1.

Figure 4:
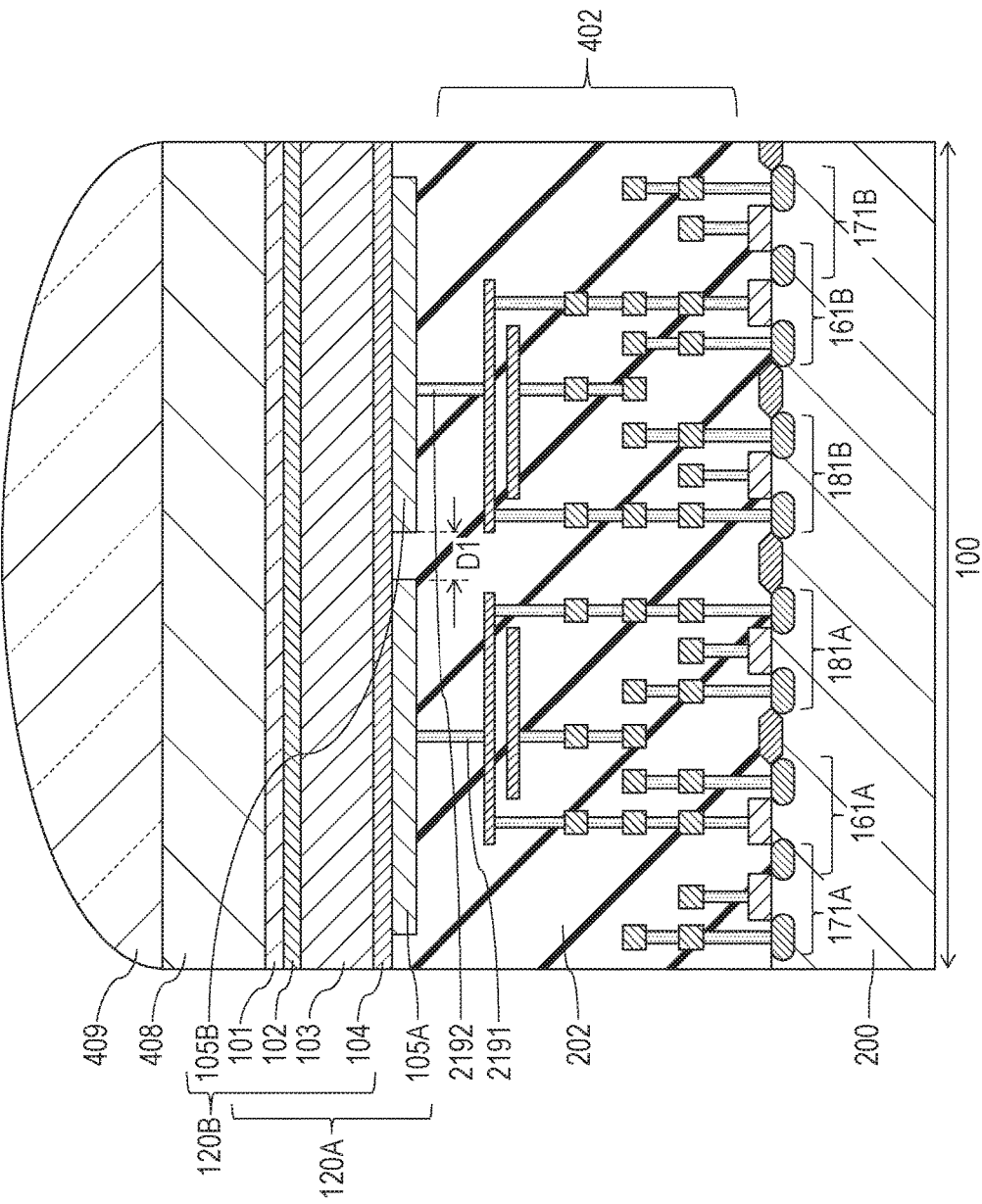
FIG. 4 is a cross-sectional schematic diagram of the pixel.

FIG. 4 is a cross-sectional schematic diagram illustrating a certain cross section of the pixel 100. Herein, a configuration will be described where a blocking layer 102 is arranged between the photoelectric conversion layer 103 and the upper electrode 101, and a blocking layer 104 is arranged between the photoelectric conversion layer 103 and the pixel electrode 105A and between the photoelectric conversion layer 103 and the pixel electrode 105B.

According to the present exemplary embodiment, the pixel 100 includes the two photoelectric conversion units, and signal output circuits are arranged with respect to the respective photoelectric conversion units. Cross-sectional structures of the photoelectric conversion unit 120A and the signal output circuit 109A and cross-sectional structures of the photoelectric conversion unit 120B and the signal output circuit 109B are similar structures. For this reason, only the cross-sectional structures of the photoelectric conversion unit 120A and the signal output circuit 109A will be described except for explanations used for describing a positional relationship between the photoelectric conversion unit 120A and the photoelectric conversion unit 120B.

The pixel array 119 of FIG. 1 includes a semiconductor substrate (for example, an Si substrate) 200, an insulation layer 202 arranged on the semiconductor substrate 200, and a wiring part 402 arranged in the insulation layer 202. The pixel 100 includes a semiconductor region arranged on the semiconductor substrate 200 and a MOS transistor constituted by electrodes arranged on the semiconductor substrate 200 as a signal output circuit.

The wiring part 402 includes a wiring for supplying the power supply to the MOS transistor and a wiring for transmitting a signal for controlling the MOS transistor. Part of the wirings included in the wiring part 402 connects the pixel electrode 105A to a gate electrode of the amplification transistor 161A via a contact part 2191.

The pixel 100 is arranged on the semiconductor substrate 200, and the two electrodes 105A and 105B are arranged so as to be adjacent but away from each other by a distance D1 on an upper part of the insulation layer 202.

Although not illustrated in the drawing, in one embodiment, a distance D2 between the pixel electrode 105A or the pixel electrode 105B and the pixel electrode of the adjacent pixel is set to be longer than the distance D1 between the pixel electrode 105A and the pixel electrode 105B. Specifically, the pixel electrode 105A in a certain pixel is arranged so as to be away from the other pixel electrode 105B in the same pixel by the distance D1 and arranged so as to be away from the pixel electrode adjacent to the pixel electrode 105A in the adjacent pixel by the distance D2.

When the pixel electrodes are arranged in the above-described manner, it is possible to suppress accumulation of charges generated in accordance with light incident on a certain pixel in the photoelectric conversion unit in the adjacent pixel. According to the above-described configuration, mixture of colors is reduced in a case where mutually adjacent pixels have different color filters.

The upper electrode 101 is arranged on the pixel electrode 105A, and the photoelectric conversion layer 103 is arranged so as to be sandwiched by each of the pixel electrodes 105A and the upper electrode 101. Furthermore, a color filter layer 408 is arranged on the upper electrode 101, and a micro lens layer 409 including a plurality of micro lenses is arranged on the color filter layer 408. It should be noted that the upper electrode 101 is provided to be commonly used by the photoelectric conversion unit 120A and the photoelectric conversion unit 120B.

A structure is adopted where light collected by a single micro lens enters the photoelectric conversion layer 103 commonly used by the two photoelectric conversion units. That is, the photoelectric conversion unit 120A including one of the pixel electrode 105A and the pixel electrode 105B, which are arranged so as to be adjacent to each other on a lower part of the same micro lens, and the photoelectric conversion unit 120B including the other pixel electrode are arranged.

A Bayer array can be used as an array of color filters in the color filter layer 408. The two pixel electrodes including the pixel electrode 105A and the pixel electrode 105B arranged in the single pixel 100 can be mutually independently controlled.

The photoelectric conversion layer 103 is a layer where charge pairs are generated to perform photoelectric conversion when incident light is received. Herein, descriptions will be provided while it is presumed that all of the photoelectric conversion layers 103 have a photoelectric conversion function, but it is sufficient when at least part of the photoelectric conversion layer 103 has the above-described photoelectric conversion function.

A semiconductor material, a compound semiconductor, and an organic semiconductor can be used as a material constituting the photoelectric conversion layer 103. Examples of the semiconductor material include intrinsic amorphous silicon (hereinafter referred to as a-Si), low-concentration P type a-Si, low-concentration N type a-Si, and the like. Examples of the compound semiconductor include a III-VI compound semiconductor such as BN, GaAs, GaP, AlSb, or GaAlAsP and a II-VI compound semiconductor such as CdSe, ZnS, or HdTe. Examples of the organic semiconductor include a phthalocyanine type material such as fullerene, coumarin 6 (C6), rhodamine 6G (R6G), quinacridone, or zinc phthalocyanine (ZnPc) and a naphthalocyanine type material.

Furthermore, a layer including quantum dots constituted by the above-described semiconductor material can be used as the photoelectric conversion layer 103. A thin film can be easily formed by using an amorphous silicon film, an organic semiconductor film, and a quantum dot film. Herein, the quantum dot refers to a particle having a particle diameter lower than or equal to 20.0 nm.

Since the intrinsic semiconductor has a low carrier density, when the intrinsic semiconductor is used as the photoelectric conversion layer 103, a wide depletion layer width can be realized, and it is possible to attain advantages of higher sensitivity, noise reduction, and the like.

The upper electrode 101 is formed of such a material that the light incident via the micro lens layer 409 and the color filter layer 408 transmits through the photoelectric conversion layer 103. For example, a compound including indium and tin such as ITO, or an oxide, or the like is used. According to the above-described configuration, it is possible to improve the sensitivity since much light can enter the photoelectric conversion layer 103. In addition to the above, for example, polysilicon or a metal having a thinness to such an extent that a predetermined amount of light transmits through may also be used as the upper electrode 101. Since the metal has low resistance, it is possible to realize lower power consumption or faster driving according to the exemplary embodiment where the metal is used as the material of the upper electrode 101.

It should be noted that a light-transmitting layer may be further provided between the upper electrode 101 and the micro lens layer 409. In one embodiment, the micro lens layer 409, the color filter layer 408, and the light-transmitting layer are designed such that a focus of the micro lens layer 409 is on the photoelectric conversion layer 103. The light-transmitting layer may be formed by using an inorganic material such as silicon oxide or silicon nitride or an organic material.

The pixel electrode 105A and the pixel electrode 105B are constituted by conductive members such as a metal. For example, the same material is used as conductive members constituting wirings or conductive members constituting pad electrodes for connection to the outside. According to the above-described configuration, the pixel electrode 105A and the pixel electrode 105B can be formed at the same time as the conductive members constituting the wirings or the pad electrodes. Therefore, it is possible to simplify manufacturing processes.

The blocking layer 102 is arranged between the upper electrode 101 and the photoelectric conversion layer 103. The blocking layer 102 is a layer including a function of suppressing injection of the signal charges from the upper electrode 101 to the photoelectric conversion layer 103. According to the present exemplary embodiment, since the signal charges are electrons, N+ type hydrogenated a-Si is used, for example, as the blocking layer 102 for suppressing injection of holes corresponding to the non-signal charges. On the other hand, in a case where the signal charges are holes, P+ type hydrogenated a-Si is used, for example, to stop injection of electrons corresponding to the non-signal charges.

It should be noted that the material of the blocking layer 102 is not limited to hydrogenated a-Si, and a P type or N type semiconductor of the semiconductor material can be used. In this case, when an impurity concentration in the semiconductor used for the blocking layer 102 is set to be higher than an impurity concentration in the semiconductor used for the photoelectric conversion layer 103, it is possible to stop the injection of the non-signal charges to the photoelectric conversion layer 103.

Similarly, the blocking layer 104 is arranged between the pixel electrode 105A and the pixel electrode 105B. The blocking layer 104 is a layer including a function of suppressing injection of the non-signal charges from the pixel electrode 105A and the pixel electrode 105B to the photoelectric conversion layer 103.

Since the material of the blocking layer 104 is the same as the material of the blocking layer 102, descriptions thereof will be omitted.

The blocking layer 102 and the blocking layer 104 are constituted such that the photoelectric conversion unit 120 has a diode characteristic. That is, in a case where the P type semiconductor is used for the blocking layer 102, the N type semiconductor is used for the blocking layer 104. At this time, electrons are used as the signal charges.

Next, a function of the photoelectric conversion unit and a function of the blocking layer will be described in detail with reference to FIG. 5, FIGS. 6A to 6C, and FIGS. 7A to 7E the present exemplary embodiment. In FIGS. 6A to 6C and FIGS. 7A to 7E, a relationship between the potential and the electric potential is reversed in a case where the signal charges are holes.

Figure 5:
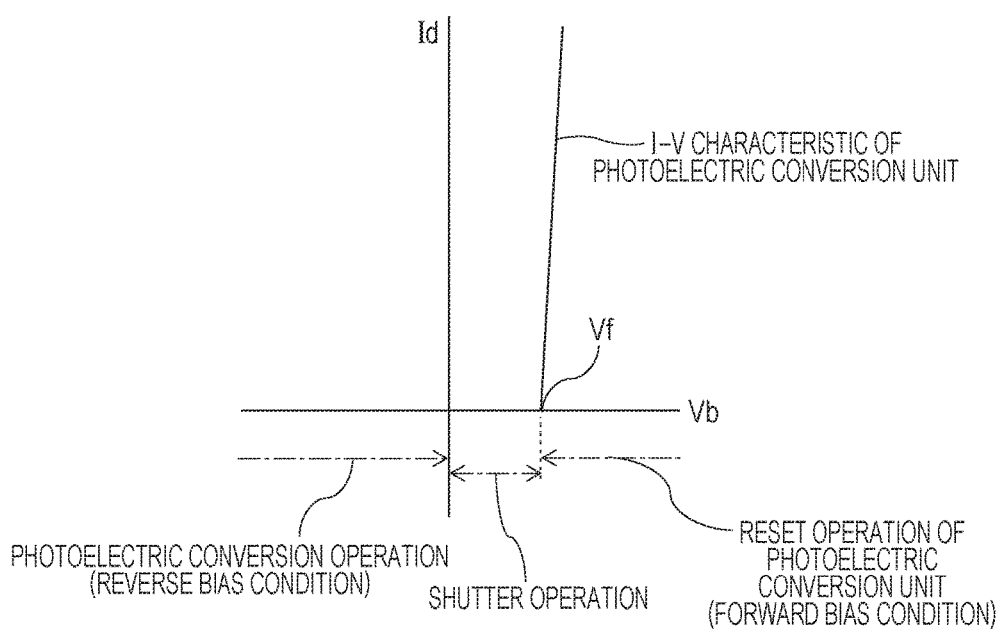
FIG. 5 is a I-V characteristic chart of a photoelectric conversion unit arranged on the pixel.

FIG. 5 illustrates a I-V characteristic of the photoelectric conversion unit. In FIG. 5, the vertical axis represents a dark current Id, and the horizontal axis represents an electric potential applied to the pixel electrode 105 of the photoelectric conversion unit. Vf indicates a forward rising voltage of the diode.

A bias condition under which the photoelectric conversion unit performs the photoelectric conversion is a photoelectric conversion operation region where a reverse bias is applied to the diode. A mode is set for performing a photoelectric conversion operation for setting such an energy band structure that the pixel electrode 105 collects the signal charges among the charge pairs generated in the photoelectric conversion layer 103 in the photoelectric conversion operation region.

A mode in a shutter operation region is set for performing a shutter operation for setting such an energy band structure that holes corresponding to the non-signal charges do not move from the photoelectric conversion layer 103 towards the pixel electrode 105 by using the blocking layer 104 and the pixel electrode 105 does not collect the signal charges.

A photoelectric conversion unit reset operation under a forward bias condition corresponds to a mode for setting such an energy band structure that a large amount of holes are injected from the upper electrode 101 and can be used as a reset operation for resetting the signal charges generated in the photoelectric conversion layer 103.

Figure 6A:
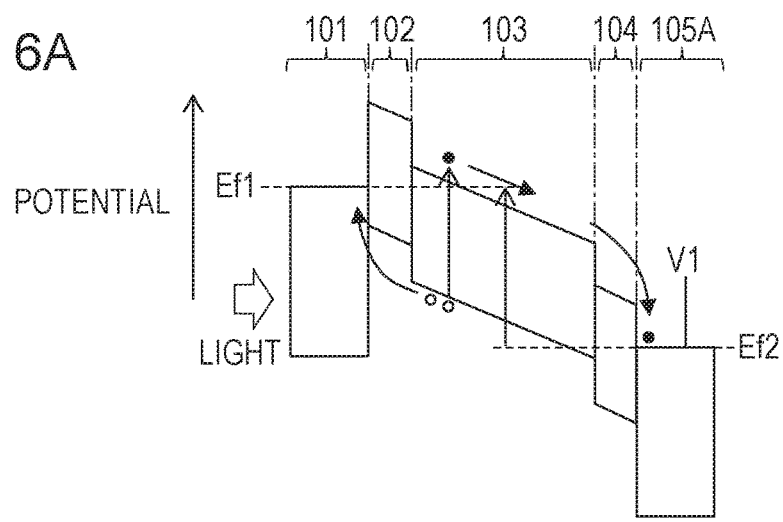
FIGS. 6A to 6C are potential characteristic charts of the photoelectric conversion unit arranged on the pixel.
Figure 6B:
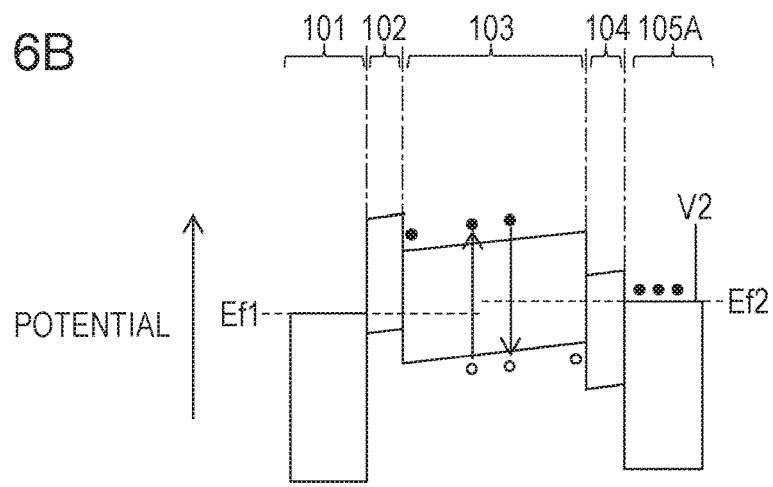
Figure 6C:
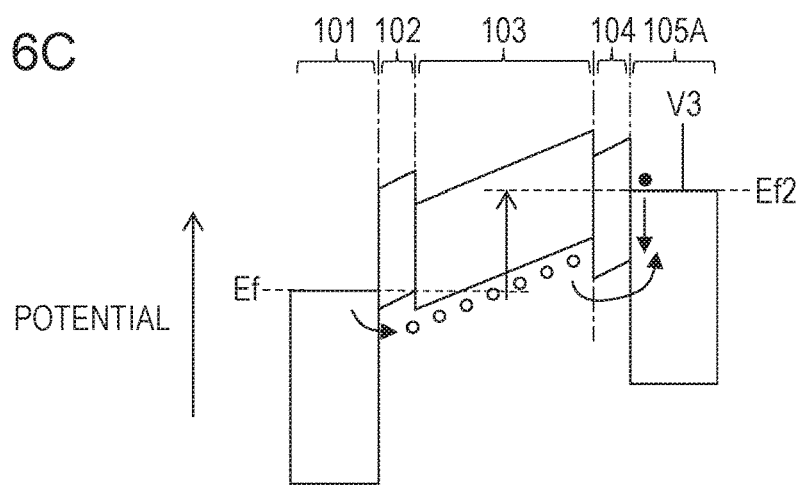

FIGS. 6A to 6C schematically illustrate an energy band in the photoelectric conversion unit and a potential in a case where application of a bias voltage is performed. FIGS. 6A to 6C illustrate energy band structures of the upper electrode 101, the blocking layer 102, the photoelectric conversion layer 103, the blocking layer 104, and the pixel electrode 105A. It should be noted however that the same also applies to energy-band diagrams of the upper electrode 101, the blocking layer 102, the photoelectric conversion layer 103, the blocking layer 104, and the pixel electrode 105B.

In FIGS. 6A to 6C, the blocking layer 102, the photoelectric conversion layer 103, and the blocking layer 104 constitute a homojunction. That is, those layers are respectively formed of semiconductor materials of the same element. To realize a blocking characteristic which will be described below, an impurity concentration of the photoelectric conversion layer 103, an impurity concentration of the blocking layer 102, and an impurity concentration of the blocking layer 104 are set to be different from one another. For example, the blocking layer 102 is formed of the P type semiconductor material, and the photoelectric conversion layer 103 is formed of an intrinsic semiconductor. The blocking layer 104 is formed of the N type semiconductor material.

According to the above-described configuration, the blocking layer 102 suppresses the injection of the electrons to the photoelectric conversion layer 103 via the upper electrode 101. The blocking layer 104 has the blocking characteristic for suppressing the injection of the holes to the photoelectric conversion layer 103 via the pixel electrode 105.

FIG. 6A corresponds to the photoelectric conversion operation in FIGS. 6A to 6C. FIG. 6B corresponds to the shutter operation in FIG. 5. FIG. 6C corresponds to the photoelectric conversion unit reset operation in FIG. 5.

The vertical axis in FIGS. 6A to 6C represents a potential with respect to the electrons. The potential with respect to the electrons is higher as the position in FIGS. 6A to 6C is higher. Therefore, the voltage is higher as the position in FIG. 5 is lower. Ef1 and Ef2 indicate Fermi levels in the respective electrodes. A band gap between a conduction band and a valence band is illustrated with regard to the blocking layer 102, the photoelectric conversion layer 103, and the blocking layer 104.

FIG. 6A illustrates a potential for collecting the signal charges by the pixel electrode 105A when the photoelectric conversion unit performs the photoelectric conversion operation corresponding to the photoelectric conversion operation in FIG. 5. The electrons and the holes generated by the photoelectric conversion are respectively represented by black circles and white circles. Since the respective photoelectric conversion units have the same configuration, only the photoelectric conversion unit including the pixel electrode 105A will be described.

The signal charges are electrons according to this exemplary embodiment. Bias setting is performed such that the photoelectric conversion unit corresponds to the photoelectric conversion operation region illustrated in FIGS. 6A to 6C. The upper electrode 101 is supplied with the fixed electric potential Vs (for example, 1.5 V). Subsequently, the pixel electrode 105A is supplied with an electric potential V1 (for example, 3.3 V) which is higher than the electric potential Vs via the capacitance 107A by the electric potential control unit 108A. At this time, the photoelectric conversion layer 103 is set as a reverse bias state to realize a depletion state. The electrons among the charge pairs generated in the photoelectric conversion layer 103 drift to the pixel electrode 105A. The pixel electrode 105A collects the signal charges during a signal accumulation period (predetermined period). The electric potential of the input node A corresponding to the pixel electrode 105A decreases in accordance with the amount of signal charges collected by the pixel electrode 105A.

At this time, in a case where the photoelectric conversion unit is in a reverse bias state and the blocking layer 102 is arranged, since the potential of the blocking layer 102 restricts the injection of the electrons from the upper electrode 101 into the photoelectric conversion layer 103, it is possible to suppress generation of a dark current.

When the collection of the signal charges progresses, the energy band structure of the photoelectric conversion layer 103 changes towards a flat band state. On the other hand, the holes generated in the photoelectric conversion layer 103 drift towards the upper electrode 101 and are discharged to the outside of the photoelectric conversion unit. At this time, in a case where the blocking layer 104 is arranged, the blocking layer 104 can suppress the injection of the holes from the pixel electrode 105 into the photoelectric conversion layer 103.

FIG. 6B illustrates a potential of the photoelectric conversion unit when the accumulation of the signal charges ends while corresponding to the shutter operation of FIG. 5. In FIG. 6B, the electric potential of the pixel electrode 105A is reduced from the electric potential V1 to an electric potential V2 (for example, 1.4 V) which is lower than the electric potential V1 and the electric potential Vs via the capacitance 107A by the electric potential control unit 108A. According to this bias condition, as illustrated in FIG. 6B, the photoelectric conversion layer 103 is put into a state close to the flat band. According to the above-described energy band structure, the pixel electrode 105A does not perform further collection of the signal charges. It is also possible to suppress the injection of the holes from the upper electrode 101 to the pixel electrode 105A. Furthermore, since the blocking layer 104 can suppress the injection of the holes from the upper electrode 101 to the photoelectric conversion layer 103, such a state is suppressed that the holes are collected into the pixel electrode 105A to increase the electric potential of the input node A.

That is, as a result of the supply of the electric potential corresponding to the shutter operation of FIG. 5 to the pixel electrode 105, when the light is incident on the photoelectric conversion layer 103, the collection of the signal charges in the pixel electrode 105 is suppressed, and it is possible to hold the electric potential of the input node A.

FIG. 6C illustrates a potential of the photoelectric conversion unit when resetting of the signal charges generated in the photoelectric conversion layer 103 is performed which corresponds to the photoelectric conversion unit reset operation of FIG. 5. Resetting of the photoelectric conversion unit can be performed by the photoelectric conversion unit reset operation illustrated in FIG. 5, and resetting of the input node can also be performed the configuration according to the present exemplary embodiment. At this time, the electric potential of the pixel electrode 105A is reduced to an electric potential V3 (for example, 0 V) which is lower than the electric potential V2 via the capacitance 107A by the electric potential control unit 108A.

Under this bias condition, as illustrated in FIG. 6C, when the photoelectric conversion layer 103 is in a forward bias condition and an electric potential difference between the upper electrode 101 and the pixel electrode 105A is sufficiently large, the holes are injected to the photoelectric conversion layer 103 from the upper electrode 101 via the blocking layer 104. Subsequently, the holes injected into the photoelectric conversion layer 103 move to the pixel electrode 105A. It is possible to reset the electric potential of the input node A to a desired electric potential by the holes that have moved to the pixel electrode 105A.

It should be noted that it is possible to reset the input node by performing at least one of the photoelectric conversion unit reset operation and the resetting of the input node A in the pixel 100 by the reset transistor 181A of FIG. 2A. It is also possible to perform still faster resetting by using those operations in combination.

At least one of the photoelectric conversion unit reset operation and the resetting of the reset transistor 181 is performed at the same time in all the pixels arranged in the pixel array 119. As a result, the input nodes in all the pixels are reset at the same time. The photoelectric conversion operation is started at the same time in all the pixels, and the electric potential of the input node A changes at the same time in all the pixels. When the shutter operation is performed at the same time in all the pixels, the change of the electric potential of the input node A ends at the same time in all the pixels. As a result, a so-called global shutter operation can be realized.

A function of the blocking layer 104 at the time of the shutter operation will be described in detail with reference to FIGS. 7A to 7E. The voltage is higher as the position in FIGS. 7B to 7E is lower. Ef5 and Ef6 indicate Fermi levels in the respective electrodes of the pixel at a position P1, and Ef3 and Ef4 indicate Fermi levels in the respective electrodes of the pixel at a position P2. In FIGS. 7B to 7E, a solid line represents an energy band structure when the photoelectric conversion operation is performed. A dotted line represents an energy band structure when the shutter operation is performed.

FIG. 7A is a schematic diagram of a frame image obtained at the time of the photoelectric conversion operation illustrated in FIG. 6A. The position P1 indicates a pixel that outputs an image signal representing darkness in the image, and the position P2 indicates a pixel that outputs an image signal representing saturation in the image. Accordingly, the pixel at the position P1 close to the darkness and the pixel at the position P2 close to the saturation exist in the same frame depending on a shooting scene.

A case will be described where, when the shutter operation is set after the photoelectric conversion operation, an electric potential is supplied to the upper electrode 101 and the pixel electrode 105 such that the energy band structure of the pixel at the position P1 close to the darkness becomes the flat band, for example.

FIGS. 7B and 7C illustrate a case of the photoelectric conversion unit when the blocking layer 104 is not arranged as a comparison example. FIGS. 7D and 7E illustrate a case where the blocking layer 104 is arranged. Herein, a configuration will be described where an electric potential of the electric potential control unit 108 is controlled in a manner that a state before the shutter operation turns to the shutter operation.

As represented by the solid lines in FIGS. 7B and 7D, before the shutter operation is performed, light is not incident on the pixel at the position P1, and the amount of generated electrons is low. Thus, the potential is close to the reverse bias state corresponding to an electric potential state at the time of the photoelectric conversion unit reset operation.

On the other hand, as represented by the solid lines in FIGS. 7C and 7E, light is incident on the pixel at the position P2, and the generated electrons are collected to decrease the electric potential of the pixel electrode 105A. For this reason, the energy band structure becomes the state close to the flat band.

A bias is applied to the photoelectric conversion layer 103 such that the energy band structure of the pixel at the position P1 corresponds to the flat band in the shutter operation. For this reason, as represented by the dotted lines in FIGS. 7B and 7D, the energy band structure of the pixel at the position P1 becomes the state close to the flat band, and the charges generated in the photoelectric conversion layer 103 while the shutter operation is performed are not collected by the pixel electrode 105.

On the other hand, as represented by the dotted line in FIGS. 7C and 7E, the electric potential of the pixel electrode 105 relatively decreases with respect to the upper electrode 101 in the pixel at the position P2, and the holes among the charge pairs generated in the photoelectric conversion layer 103 are facilitated to drift and move towards the pixel electrode 105 during the shutter operation.

As illustrated in FIG. 7C, the drifted holes invade the pixel electrode 105A in accordance with the applied bias in a related-art structure. As a result, there is a risk that the electric potential of the pixel electrode 105A increases, and a contrast of the image decreases. A similar phenomenon occurs with regard to pixels having intermediate signal charges with respect to the pixel at the position P1 and the pixel at the position P2.

On the other hand, the blocking layer 104 is arranged between the photoelectric conversion layer 103 and the pixel electrode 105A in the case of the photoelectric conversion unit 120A according to the exemplary embodiment of the disclosure as represented by the dotted line in FIG. 7E. The blocking layer 104 includes a potential barrier with respect to the holes. For this reason, even when the holes drift from the photoelectric conversion layer 103 to the pixel electrode 105A during a period in which the shutter operation is performed, the blocking layer 104 can stop the invasion of the holes from the photoelectric conversion layer 103 to the pixel electrode 105A.

For this reason, according to one exemplary embodiment of the disclosure, a configuration is adopted where the blocking layer 104 is arranged on an interface of the photoelectric conversion layer 103, and the potential barrier with respect to the holes is sufficiently high.

According to the above-described configuration, it is possible to suppress the fluctuation of the electric potential of the input node A/B which occurs as a result of the injection of the holes from the photoelectric conversion layer 103 to the pixel electrode 105A when the shutter operation is performed. In addition, the sufficient shutter effects are realized in all the pixels.

Since the signal charges are not injected from the upper electrode 101 and the holes are not injected from the pixel electrode 105A in the photoelectric conversion operation, it is possible to reduce the fluctuation of the electric potential of the input node A/B caused by the dark current.

Figure 8B:
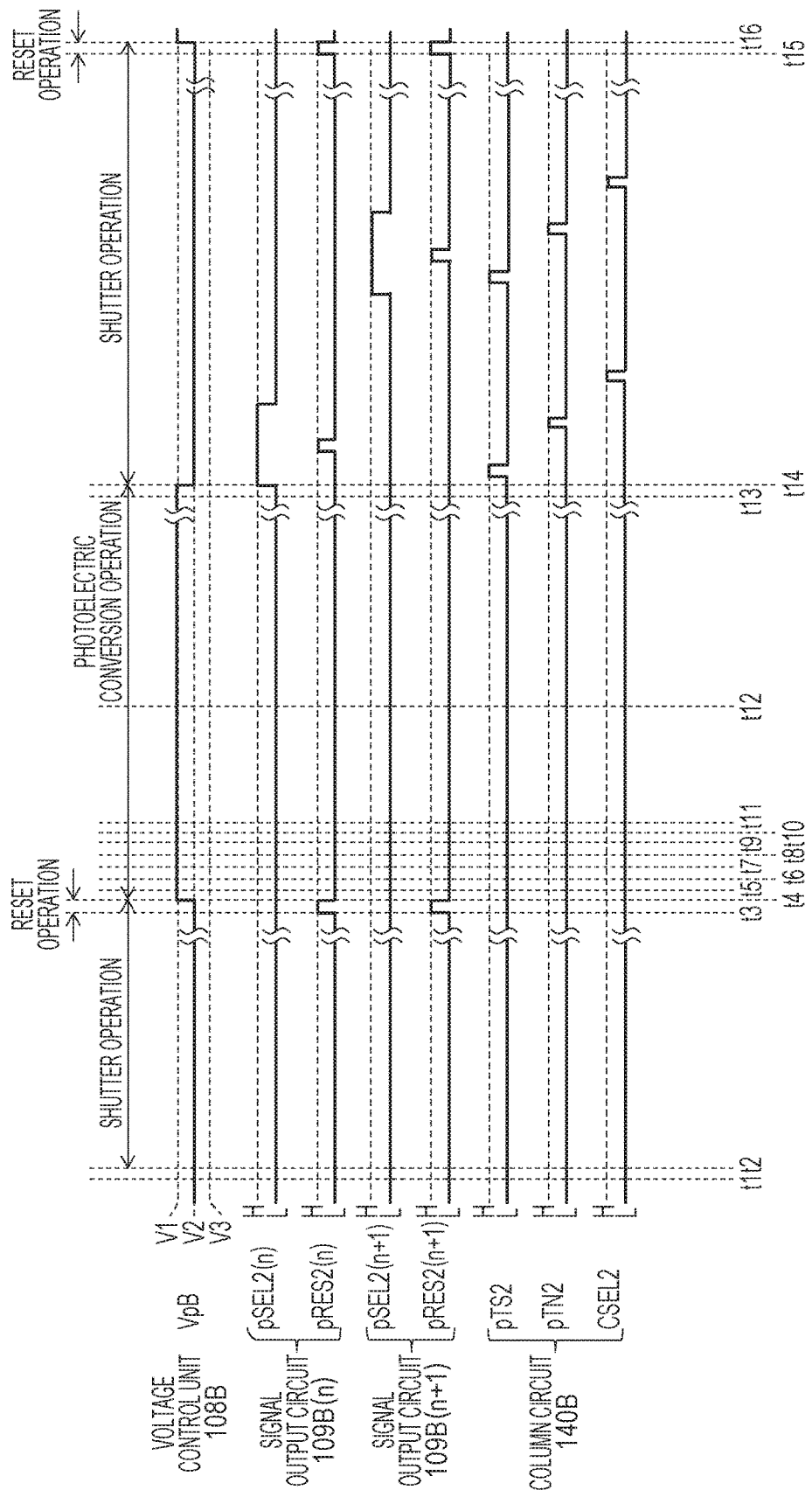

Next, driving timings of the photoelectric conversion apparatus according to the present exemplary embodiment will be described with reference to FIGS. 8A and 8B. FIGS. 8A and 8B are driving timing charts of driving pulses of the electric potential control unit 108A/108B, the signal output circuit 109A/109B, and the column circuit 140A/140B used in the photoelectric conversion apparatus according to the present exemplary embodiment. According to the present exemplary embodiment, the electric potential control units 108A in the respective pixel rows perform the same driving. Similarly, the electric potential control units 108B in the respective pixel rows perform the same driving.

FIGS. 8A and 8B illustrate the driving pulses corresponding to the signal output circuits 109A and the column circuits 140A in two rows including the n-th row and the (n+1)-th row and the driving pulses corresponding to the signal output circuits 109B and the column circuits 140B in the n-th row and the (n+1)-th row to simplify the descriptions. In FIGS. 8A and 8B, the respective elements are put into an on state during a period in which the respective drive pulses are at a high level (H), and the respective elements are turned off during a low level (L) period.

The electric potential V3 is an electric potential supplied from the electric potential control unit 108A/108B to the pixel electrode 105A/105B in the photoelectric conversion unit reset operation. The electric potential V2 is an electric potential which is higher than the electric potential V3 and is supplied from the electric potential control unit 108A/108B to the pixel electrode 105A/105B in the shutter operation. The electric potential V1 is an electric potential which is higher than the electric potential V2 and is supplied from the electric potential control unit 108A/108B to the pixel electrode 105A/105B in the photoelectric conversion operation.

FIGS. 8A and 8B illustrate driving timings during the first period, the second period, and a third period. The third period represents driving timings of a period in which, after the electric potential of the input node A is reset by the reset transistor 181A, the pixel electrode 105A collects charges, and the signal output circuit 109B does not output a signal. The first period represents driving timings of a period in which, after the electric potential of the input node B is reset, the pixel electrode 105B collects charges, and the signal output circuit 109A outputs a signal. The second period represents driving timings of a period in which the pixel electrode 105A collects charges, and the signal output circuit 109B outputs a signal.

At a time t1, the electric potential VpA of the electric potential control unit 108A is the electric potential V2. The drive pulses pSEL1, pSEL2, pTN1, pTN2, pTS1, pTS2, and pRES2 are at the L level in the respective elements in the n-th row and the (n+1)-th row and the respective elements in the column circuit 140A in the m-th column. The drive pulse pRES1 in the n-th row and the (n+1)-th row changes from the L level to the H level.

At a time t2, the drive pulse pRES1 in the n-th row and the (n+1)-th row changes from the H level to the L level. During a period t1 to t2, the reset operation for resetting the input node A is performed. It should be noted that, during the period t1 to t2, the drive pulse pRES2 may turn to the H level, and the L level to reset the input node B.

It should be noted that, during the period t1 to t2, the electric potential of the electric potential control unit 108A/108B may be changed from the electric potential V2 to the electric potential V3, and the photoelectric conversion unit reset operation illustrated in FIG. 5 may be performed as the reset operation while the reset operation by the reset transistor 181A is also performed in combination.

In addition, at the time t2, the electric potential VpA supplied to the pixel electrode 105A changes from the electric potential V2 to the electric potential V1, and the pixel electrode 105A starts the photoelectric conversion operation to perform collection of the charges. The pixel electrode 105B performs the shutter operation and does not perform the collection of the charges.

At a time t3, the drive pulse pRES2 in the n-th row and the (n+1)-th row changes from the L level to the H level. Subsequently, at a time t4, the drive pulse pRES2 in the n-th row and the (n+1)-th row changes from the H level to the L level. The reset operation is performed to reset the input node B during a period t3 to t4.

At the time t4, the electric potential VpA of the electric potential control unit 108A changes from the electric potential V1 to the electric potential V2, and the collection of the charges ends in the pixel electrode 105A. For this reason, the photoelectric conversion operation ends, and the shutter operation starts in the pixel electrode 105A. Subsequently, the signal output circuit 109A starts output of a signal based on the charges collected by the pixel electrode 105A during a period t2 to t4 to the signal line 130. In addition, the electric potential of the electric potential control unit 108B changes from the electric potential V2 to the electric potential V1, and the collection of the charges starts in the pixel electrode 105B. That is, since the shutter operation ends, the pixel electrode 105B starts the photoelectric conversion operation.

The period t2 to t4 is equivalent to the above-described third period. During the third period, the pixel electrode 105A performs the photoelectric conversion operation, and the electric potential of the input node A in the n-th row and the (n+1)-th row of the signal output circuit 109A changes. On the other hand, the pixel electrode 105B performs the shutter operation. At this time, the electric potential of the input node B in the n-th row and the (n+1)-th row remains at the reset electric potential. The signal output circuit 109B does not perform the output of the signal to the signal line 130B.

Furthermore, at the time t4, the drive pulse pSEL1(n) turns to the H level, and the pixel row in the n-th row is selected.

The drive pulse pTS1 turns to the H level at a time t5 and turns to the L level at a time t6. As a result, the signal S+N including the electric potential of the input node A in the n-th row and the threshold variation of the amplification transistor 161A is held in the capacitance 320 of the column circuit 140A.

The drive pulse pRES1(n) turns to the H level at a time t7, and the drive pulse pRES1(n) turns to the L level at a time t8. As a result, the input node A of the pixel in the n-th row becomes the reset voltage Vres.

The drive pulse pTN1 turns to the H level at a time t9 and turns to the L level at a time t10. As a result, the signal N including the threshold variation of the amplification transistor 161A is held in the capacitance 321 of the column circuit 140.

At a time t11, the drive pulse pSEL1(n) turns to the L level. As a result, the selection of the pixel row in the n-th row ends. At a time t12, the drive pulse pSEL1(n+1) turns to the H level, and the pixel row in the (n+1)-th row is selected.

During a period t11 to t12, a signal is output from the column circuit 140A to the output amplifier unit 203A column by column in the respective pixels in the n-th row on the basis of the drive pulse CSEL1. The output amplifier unit 203A outputs a difference between the signal S+N and the signal N from the output terminal DOUT1 via the analog-to-digital conversion unit 204A.

During a period t12 to t13, output of signals from the signal output circuit 109A and the column circuit 140A in the (n+1)-th row is performed. Since this operation is similar to the operation during a period t4 to t12, descriptions thereof will be omitted.

During a period t13 to t14, the drive pulse pRES1 is put into an on state, the electric potential of the input node A in the n-th row and the (n+1)-th row is reset by the reset operation. At a time t14, the electric potential VpA of the electric potential control unit 108A changes from the electric potential V2 to the electric potential V1, and the electric potential of the electric potential control unit 108B changes from the electric potential V1 to the electric potential V2.

A period t4 to t14 is equivalent to the above-described first period. During the period t4 to t14, the pixel electrode 105B performs the photoelectric conversion operation. In addition, since the pixel electrode 105B collects the charges, the electric potential of the input node B of the signal output circuit 109B changes.

A period t14 to t16 is equivalent to the above-described second period. During the period t14 to t16, the driving timings of the electric potential control unit 108A, the signal output circuit 109A, and the column circuit 140A are equivalent to the driving timings of the electric potential control unit 108B, the signal output circuit 109B, and the column circuit 140B during the period t4 to t14. The driving timings of the electric potential control unit 108B, the signal output circuit 109B, and the column circuit 140B during the period t14 to t16 are equivalent to the driving timings of the electric potential control unit 108A, the signal output circuit 109A, and the column circuit 140A during the period t4 to t14.

With these configurations, the charges generated in the photoelectric conversion layer 103 can be collected by the pixel electrode 105B during the period in which the signal output circuit 109A outputs the signal. In addition, the signal charges generated in the photoelectric conversion layer 103 can be collected by the pixel electrode 105A during the period in which the signal output circuit 109B outputs the signal.

According to the configuration of the present exemplary embodiment, it is possible to use the signal charges generated in the photoelectric conversion layer 103 during the period in which the signal is output from the pixel.

It should be noted that it is sufficient when at least part of the periods of the photoelectric conversion operation on the pixel electrode 105A and the shutter operation on the pixel electrode 105B are overlapped with each other. With the above-described configuration too, the period in which the charges generated in the photoelectric conversion layer 103 are not detected as the signals can be shortened in the shutter operation, and it is possible to improve a use efficiency of the signal charges. It should be noted however that the operations in the first period and the second period may be continuously performed as in the present exemplary embodiment. This state of "continuously" includes a driving in which the first period and the second period are continuous once each and a configuration in which the first period and the second period are alternately repeated.

In addition, according to the present exemplary embodiment, the global electron shutter operation has been described. Specifically, according to the above-described operation, the reset transistors 181A in the respective rows are simultaneously put into an on state during the period t1 to t2, and the reset transistors 181B in the respective rows are simultaneously put into an on state during the period t3 to t4. However, a rolling shutter operation may be performed instead. The rolling shutter operation may be performed in which the reset transistors 181A in the respective rows are sequentially put into an on state during the period t1 to t2, and the reset transistors 181B in the respective rows are sequentially put into an on state during the period t3 to t4. This configuration can be applied to all of the exemplary embodiments.

Second Exemplary Embodiment

The photoelectric conversion apparatus according to the present exemplary embodiment will be described with reference to FIGS. 9A to 9C, FIG. 10, FIGS. 11A to 11C, and FIGS. 12A and 12B. FIG. 1, FIG. 3, and FIG. 5 are similar to the first exemplary embodiment. Parts including functions similar to FIG. 1 to FIGS. 8A and 8B are assigned with similar reference signs, and detailed descriptions thereof will be omitted.

Figure 9A:
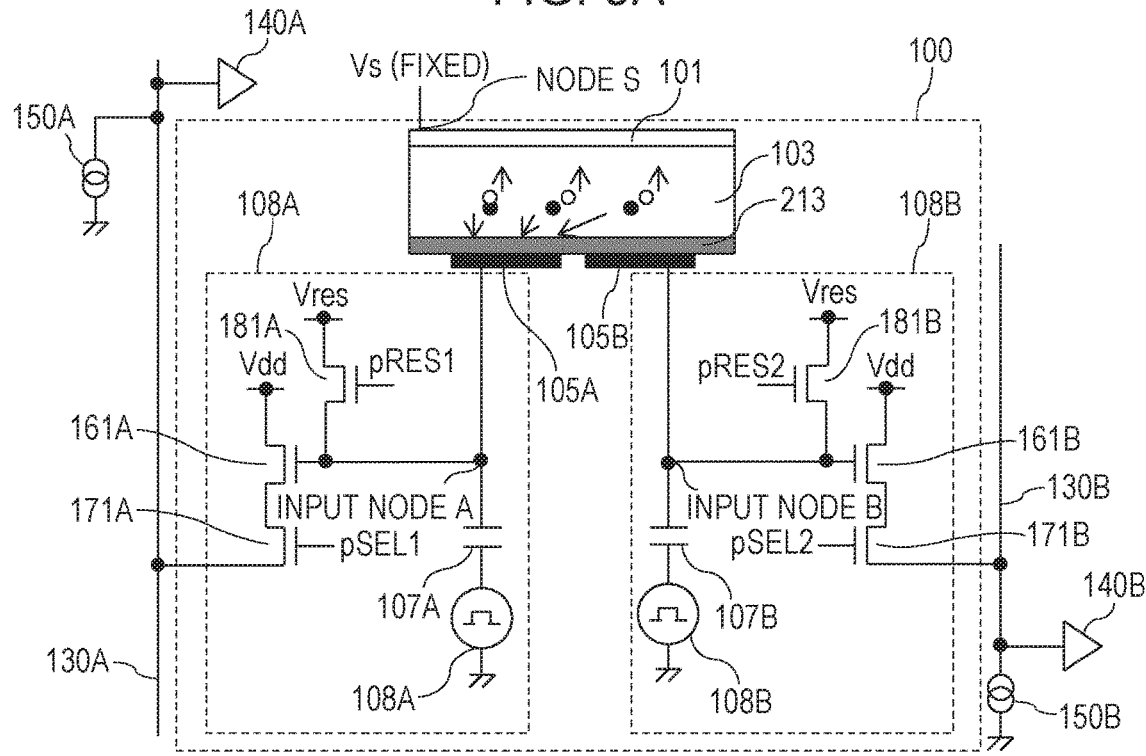
FIGS. 9A to 9C are equivalent circuit diagrams of the pixel arranged in the photoelectric conversion apparatus.
Figure 9B:
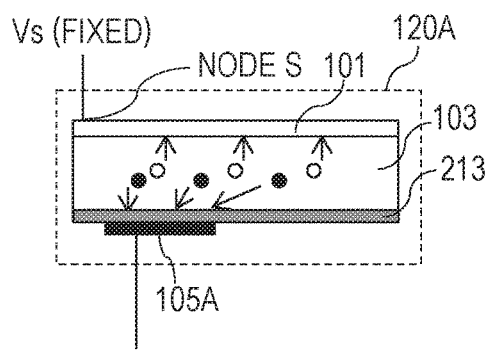
Figure 9C:
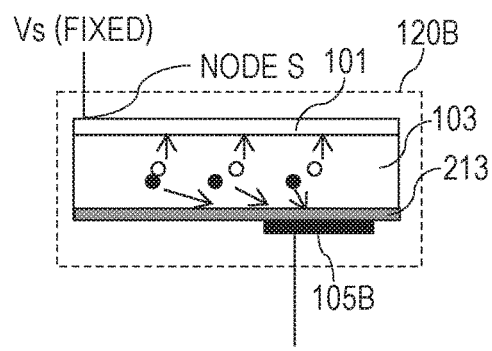

FIGS. 9A to 9C are equivalent circuit diagrams of the pixel 100 according to the second exemplary embodiment. As illustrated in FIG. 9A, an insulation film 213 is arranged between the photoelectric conversion layer 103 and the pixel electrode 105A and arranged between the photoelectric conversion layer 103 and the pixel electrode 105B in the pixel 100 according to the present exemplary embodiment.

In FIG. 9B, the photoelectric conversion unit 120A includes the upper electrode 101, the photoelectric conversion layer 103, the pixel electrode 105A, and the insulation film 213. The photoelectric conversion unit 120A includes a capacitance component between the upper electrode 101 and the pixel electrode 105A and constitutes the photodiode. In FIG. 9C, the photoelectric conversion unit 120B includes the upper electrode 101, the photoelectric conversion layer 103, the pixel electrode 105B, and the insulation film 213. The photoelectric conversion unit 120B includes a capacitance component between the upper electrode 101 and the pixel electrode 105B and constitutes the photodiode. It should be noted that the blocking layer 102 may be arranged between the upper electrode 101 and the photoelectric conversion layer 103.

In a case where the pixel electrode 105A accumulates charges, the charges generated in the photoelectric conversion layer 103 are accumulated in the region in contact with the insulation film 213 in the photoelectric conversion layer 103 by an electric field between the pixel electrode 105A and the photoelectric conversion layer 103.

In a case where the pixel electrode 105B accumulates charges, the charges generated in the photoelectric conversion layer 103 are accumulated in the region in contact with the insulation film 213 in the photoelectric conversion layer 103 by an electric field between the pixel electrode 105B and the photoelectric conversion layer 103.

FIG. 10 illustrates a structure example along a certain cross section of the pixel 100. Here, only a configuration different from FIG. 4 according to the first exemplary embodiment will be described.

In FIG. 10, the insulation film 213 is arranged between the insulation layer 202 and the photoelectric conversion layer 103, between the pixel electrode 105A and the photoelectric conversion layer 103, and between the pixel electrode 105B and the photoelectric conversion layer 103.

An insulating material is used as the insulation film 213. For example, an inorganic material such as silicon oxide, amorphous silicon oxide, silicon nitride, or amorphous silicon nitride or an organic material is used as the material for the insulation film 213. In one embodiment, a thickness of the insulation film 213 is set as a thickness to such an extent that the charges are not transmitted through by a tunnel effect. When the above-described configuration is adopted, a leak current can be reduced, so that it is possible to reduce the noise. In one embodiment, the thickness of the insulation film 213 is set as 50 nm or thicker.

Figure 11A:
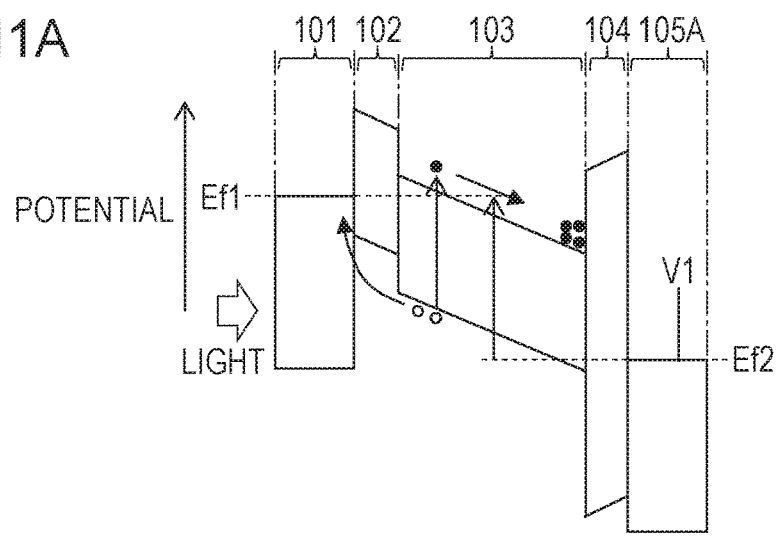
FIGS. 11A to 11C are potential characteristic charts of the photoelectric conversion unit arranged on the pixel.
Figure 11B:
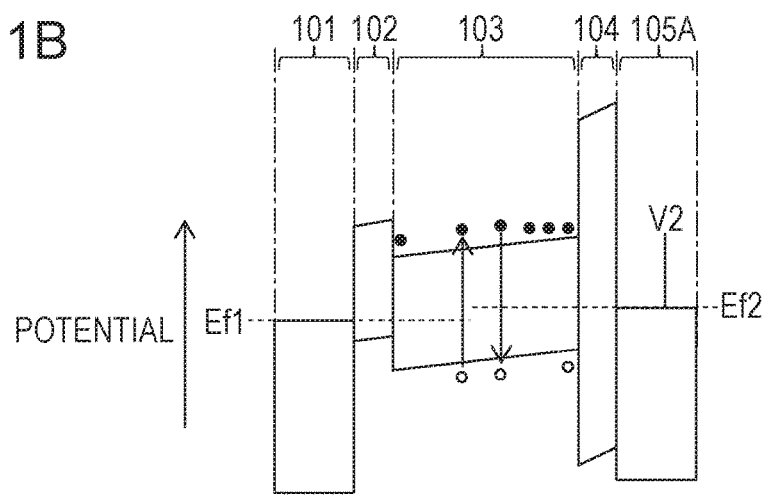
Figure 11C:
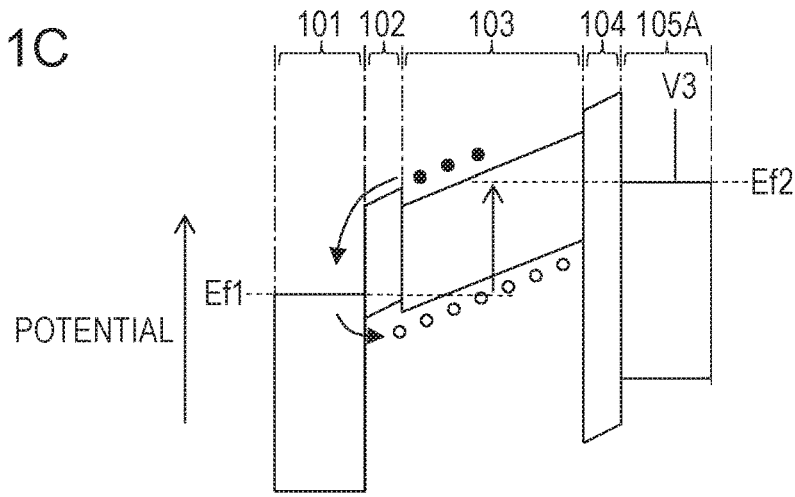

FIGS. 11A to 11C illustrate a potential of the photoelectric conversion unit for describing a signal output operation by the photoelectric conversion apparatus according to the present exemplary embodiment. The potential with respect to the electrons is lower as the position in FIGS. 11A to 11C is lower. It should be noted however that, in FIGS. 11A to 11C, a relationship between the potential and the electric potential is reversed in a case where the signal charges are the holes. FIGS. 11A to 11C illustrate states of the potentials in the respective regions of the upper electrode 101, the photoelectric conversion layer 103, the insulation film 213, and the pixel electrode 105 in the stated order from the left. Herein, the blocking layer 102 is omitted to simplify the descriptions. In FIGS. 11A to 11C, a black circle represents an electron, and a white circuit represents a hole.

According to the present exemplary embodiment, the reset voltage is set as 1 V, and the electric potential Vs supplied to the upper electrode 101 is set as 3 V. Furthermore, a bias voltage Va can be switched to 5 V or 0 V by the electric potential control unit 108. The numeric values mentioned herein are examples, and the value of the bias voltage is not limited.

FIG. 11A illustrates a potential for collecting the signal charges by the pixel electrode 105A when the photoelectric conversion unit performs the photoelectric conversion operation corresponding to the photoelectric conversion operation in FIG. 5. The electrons and the holes generated by the photoelectric conversion are respectively represented by black circles and white circles. It should be noted that, according to the present exemplary embodiment, the collection of the charges by the pixel electrode 105 represents a configuration where the charges are collected and accumulated in a region in contact with the insulation film 213 in the photoelectric conversion layer 103.

The signal charges are electrons according to this exemplary embodiment. Bias setting is performed such that the photoelectric conversion unit corresponds to the photoelectric conversion operation region illustrated in FIG. 5. The upper electrode 101 is supplied with the fixed electric potential Vs (for example, 1.5 V).

The pixel electrode 105 is supplied with the electric potential V1 (for example, 3.3 V) which is higher than the electric potential Vs via the capacitance 107 by the electric potential control unit 108 of FIG. 2A. At this time, the photoelectric conversion layer 103 is set as the reverse bias state to realize the depletion state. Subsequently, the electrons among the charge pairs generated in the photoelectric conversion layer 103 drift in the direction of the pixel electrode 105, but the potential of the insulation film 213 functions as the barrier, and the charges are accumulated in a region in the vicinity of the insulation film 213 in the photoelectric conversion layer 103. Herein, the signal charges are accumulated during a predetermined period (charge accumulation period), the electric potential of the pixel electrode 105 changes in accordance with the accumulated signal charge amount, and the electric potential of the input node A/B decreases.

At this time, in a case where the photoelectric conversion unit is in the reverse bias state and the blocking layer 102 is arranged, the potential of the blocking layer 102 suppresses the injection of the electrons from the upper electrode 101 to the photoelectric conversion layer 103. For this reason, it is possible to suppress the generation of the dark current.

When the collection of the signal charges progresses, the photoelectric conversion layer 103 changes towards the flat band state. At this time, the electric potential V2 (for example, 1.4 V) which is lower than the electric potential V1 is supplied by the electric potential control unit 108 of FIG. 2A via the capacitance 107. According to this bias condition, as illustrated in FIG. 11B, the energy band structure of the photoelectric conversion layer 103 becomes the state close to the flat band. According to the above-described energy band structure, the pixel electrode 105 can hold the signal charge amount accumulated during the period of FIG. 11A in the region in the vicinity of the insulation film 213 in the photoelectric conversion layer 103. In addition, it is possible to suppress the injection of the holes from the upper electrode 101 to the region in contact with the insulation film 213 where the signal charges are accumulated. For this reason, it is possible to suppress the injection of the holes from the upper electrode 101 into the region in the vicinity of the insulation film 213 in the photoelectric conversion layer 103, and the increase in the electric potential of the input node A/B can be suppressed.

That is, as a result of the supply of the electric potential corresponding to the shutter operation region to the pixel electrode 105, when light is incident on the photoelectric conversion layer 103, the collection of the signal charges into the region in contact with the insulation film 213 in the photoelectric conversion layer 103 is suppressed. For this reason, it is possible to hold the electric potential of the input node A/B.

FIG. 11C corresponds to the photoelectric conversion unit reset operation of FIG. 5 and illustrates the potential of the photoelectric conversion unit when the resetting of the signal charges accumulated in the region in contact with the insulation film 213 in the photoelectric conversion layer 103 is performed. When the resetting of the photoelectric conversion unit is performed by the photoelectric conversion unit reset operation illustrated in FIG. 5, the electric potential of the input node A can be changed from the reset electric potential by the amount corresponding to the signal charges accumulated by the photoelectric conversion unit. That is, when the photoelectric conversion unit reset operation is performed, it is possible to output the signal from the signal output circuit 109A.

In the photoelectric conversion unit reset operation, the electric potential is reduced to the electric potential V3 (for example, 0 V) which is lower than the electric potential V2 in the pixel electrode 105 by the electric potential control unit 108 via the capacitance 107.

With regard to this bias condition, as illustrated in FIG. 11C, a large number of holes from the upper electrode 101 are injected into the photoelectric conversion layer 103 under the forward bias condition and moved to the region in the vicinity of the insulation film 213 in the photoelectric conversion layer 103.

At this time, when the electric potential difference between the upper electrode 101 and the pixel electrode 105 is sufficiently large, the holes are injected from the upper electrode 101 into the photoelectric conversion layer 103. The injected holes promptly drift to the region in the vicinity of the insulation film 213 in the photoelectric conversion layer 103 by the bias voltage, and it is possible to reset the electric potential of the input node A/B to a desired electric potential.

Figure 12A:
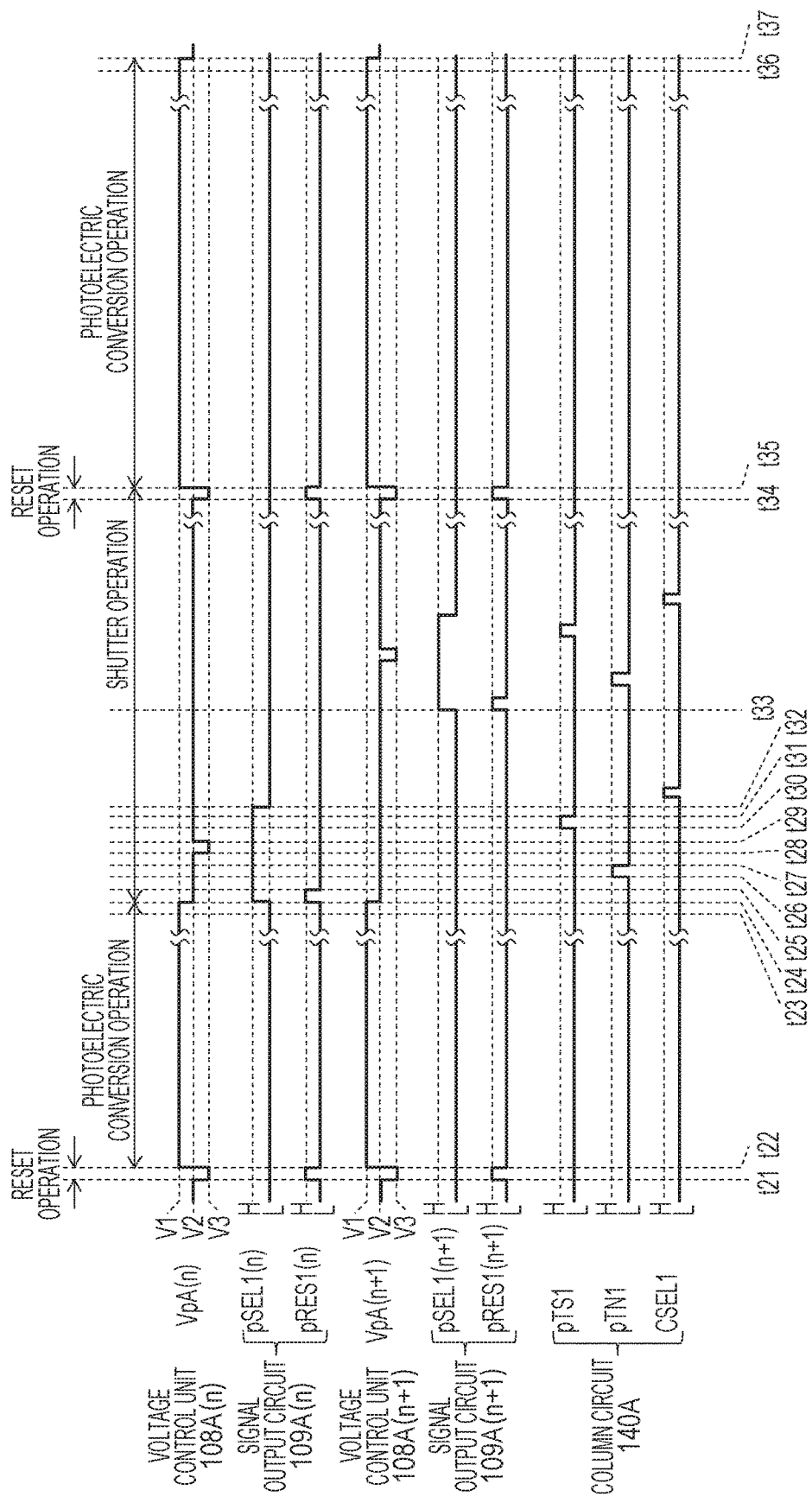
FIGS. 12A and 12B are driving timing charts of the photoelectric conversion apparatus.
Figure 12B:
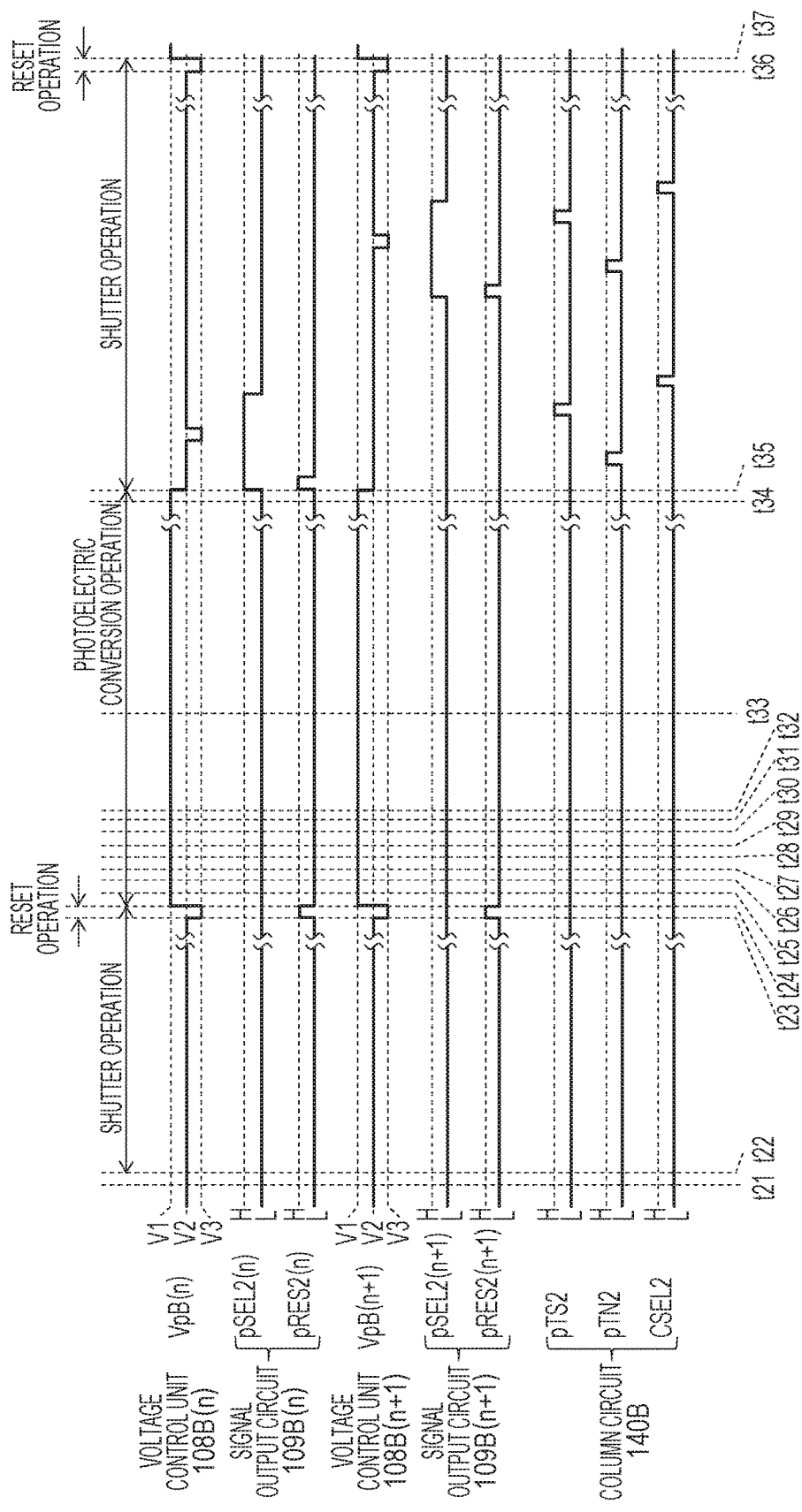

Next, driving timings of the photoelectric conversion apparatus according to the present exemplary embodiment will be described with reference to FIGS. 12A and 12B. A difference between the driving timings according to the present exemplary embodiment illustrated in FIGS. 12A and 12B and the driving timings according to the first exemplary embodiment illustrated in FIGS. 8A and 8B resides in that the electric potential control units 108 are controlled row by row during the signal output period. Here, descriptions of the same driving timings as those of FIGS. 8A and 8B will be omitted.

At a time t21, with regard to the electric potential control unit 108A in n-th row and the (n+1)-th row, the electric potential VpA changes from the electric potential V2 to the electric potential V3, and the drive pulse pRES1 in the n-th row and the (n+1)-th row changes from the L level to the H level. Subsequently, at a time t22, with regard to the electric potential control unit 108A in n-th row and the (n+1)-th row, the electric potential VpA changes from the electric potential V3 to the electric potential V1, and the drive pulse pRES1 in the n-th row and the (n+1)-th row changes from the H level to the L level.

The reset operation for resetting the input node A and the photoelectric conversion unit reset operation are performed during a period t21 to t22.

At a time t23, an electric potential VpB of the electric potential control unit 108B in the n-th row and the (n+1)-th row changes from the electric potential V2 to the electric potential V3, and the drive pulse pRES2 in the n-th row and the (n+1)-th row changes from the L level to the H level. Subsequently, at a time t24, the electric potential VpB of the electric potential control unit 108B in the n-th row and the (n+1)-th row changes from the electric potential V3 to the electric potential V1, and the drive pulse pRES2 in the n-th row and the (n+1)-th row changes from the H level to the L level.

The reset operation for resetting the input node B and the photoelectric conversion unit reset operation are performed during a period t23 to t24.

At the time t24, the electric potential VpA of the electric potential control unit 108A in n-th row and the (n+1)-th row changes from the electric potential V1 to the electric potential V2.

A period t22 to t24 is equivalent to the above-described third period.

Furthermore, at the time t24, the drive pulse pSEL1(n) turns to the H level, the pixel row in the n-th row is selected, and the drive pulse pRES1(n) turns to the H level. At a time t25, the drive pulse pRES1(n) turns to the L level. The input node A of the pixel in the n-th row has the reset voltage Vres during a period t24 to t25.

The drive pulse pTN1 turns to the H level at a time t26 and turns to the L level at a time t27. As a result, the signal N including the threshold variation of the amplification transistor 161A is held by the capacitance 321 of the column circuit 140.

At a time t28, the electric potential control unit 108A(n) changes the electric potential VpA from the electric potential V2 to the electric potential V3. At a time t29, the electric potential control unit 108A(n) changes the electric potential VpA from the electric potential V3 to the electric potential V2. The electric potential of the pixel electrode 105A increases in response to the discharge of the signal charges from the photoelectric conversion layer 103 to the upper electrode 101. This increase amount corresponds to the electric potential based on the signal charges discharged from the photoelectric conversion layer 103. As a result, the amplification transistor 161A discharges a signal based on the signal charge amount accumulated in the photoelectric conversion layer 103 to the signal line 130A.

The drive pulse pTS1 turns to the H level at a time t30 and turns to the L level at a time t31. As a result, the signal S+N including the electric potential of the input node A in the n-th row and the threshold variation of the amplification transistor 161A is held in the capacitance 320 of the column circuit 140A.

At a time t32, the drive pulse pSEL1(n) turns to the L level, and the selection of the pixel row in the n-th row ends. At a time t33, the drive pulse pSEL1(n+1) turns to the H level, and the pixel row in the (n+1)-th row is selected.

The signals of the respective pixels in the n-th row are output to the output amplifier unit 203A column by column on the basis of the drive pulse CSEL1 during a period t32 to t33. The output amplifier unit 203A outputs the difference between the signal S+N and the signal N from the output terminal DOUT1 via the analog-to-digital conversion unit 204A.

The signal output from the pixel 100 and the column circuit 140A in the (n+1)-th row and subsequent rows is performed at the time t33 and subsequent times. Since this operation is similar to an operation during a period t24 to t32, descriptions thereof will be omitted.

During a period t34 to t35, the drive pulse pRES1 is put into an on state, and the reset operation for resetting the electric potential of the input node A in the n-th row and the (n+1)-th row is performed.

At the time t34, the electric potential VpA of the electric potential control unit 108A in the n-th row and the (n+1)-th row changes from the electric potential V2 to the electric potential V3. At a time t35, the electric potential VpA of the electric potential control unit 108A changes from the electric potential V3 to the electric potential V1, and the electric potential of the electric potential control unit 108B changes from the electric potential V1 to the electric potential V2.

The reset operation for resetting the input node A of the amplification transistor 161 and the photoelectric conversion unit reset operation are performed during the period t34 to t35.

A period t24 to t35 is equivalent to the above-described first period. With the configuration according to the present exemplary embodiment too, during the period in which the signal output circuit 109A outputs the signal, the charges generated in the photoelectric conversion layer 103 can be collected in the region in contact with the insulation film 213 in the photoelectric conversion layer 103.

A period t35 to t37 is equivalent to the above-described second period. The driving timings of the electric potential control unit 108A, the signal output circuit 109A, and the column circuit 140A during the period t35 to t37 are equivalent to the driving timings of the electric potential control unit 108B, the signal output circuit 109B, and the column circuit 140B during the period t24 to t35. In addition, the driving timings of the electric potential control unit 108B, the signal output circuit 109B, and the column circuit 140B during the period t35 to t37 are equivalent to the driving timings of the electric potential control unit 108A, the signal output circuit 109A, and the column circuit 140A during the period t24 to t35.

The charges generated in the photoelectric conversion layer 103 can be collected in the region in contact with the insulation film 213 in the photoelectric conversion layer 103 during the period in which the signal is output from the signal output circuit 109B.

According to the configuration of the present exemplary embodiment, it is possible to use the signal charges generated in the photoelectric conversion layer 103 during the period in which the signal is output from the pixel.

Third Exemplary Embodiment

The photoelectric conversion apparatus according to the present exemplary embodiment will be described with reference to FIG. 13 and FIGS. 14A and 14B. The photoelectric conversion apparatus according to the present exemplary embodiment can include the configuration illustrated in FIG. 1 and FIG. 3. Parts including functions similar to FIG. 1 to FIGS. 12A and 12B are assigned with similar reference signs, and detailed descriptions thereof will be omitted.

Figure 13:
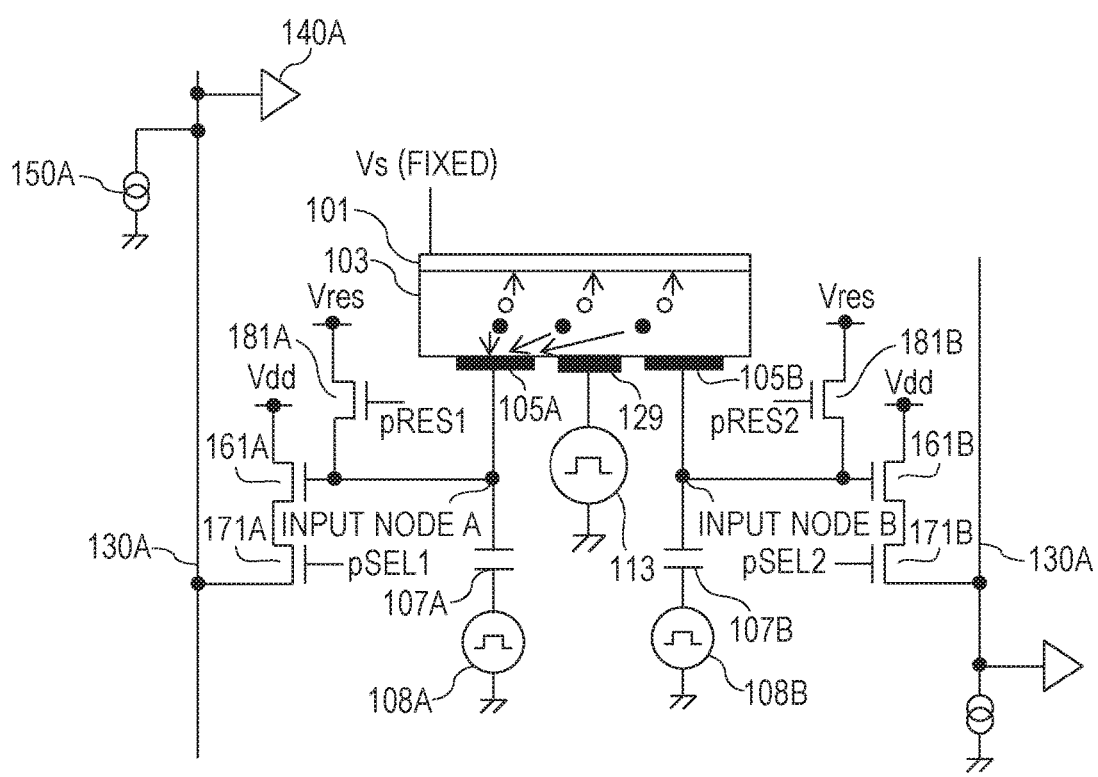
FIG. 13 is an equivalent circuit diagram of the pixel arranged in the photoelectric conversion apparatus.

FIG. 13 is an equivalent circuit diagram of the pixel 100 according to the present exemplary embodiment. As illustrated in FIG. 13, according to the present exemplary embodiment, an auxiliary electrode 129 is arranged at a position facing the upper electrode 101 while the photoelectric conversion layer 103 is sandwiched therebetween corresponding to a position between the pixel electrode 105A and the pixel electrode 105B. The auxiliary electrode 129 is connected to an electric potential control unit 113, and the electric potential control unit 113 supplies an electric potential Vc (for example, 2.4 V) to the auxiliary electrode 129. The electric potential Vc is an electric potential lower than the electric potential V1 and higher than the electric potential V3.

Driving timings of the photoelectric conversion apparatus according to the present exemplary embodiment will be described with reference to FIGS. 14A and 14B. Herein, a difference from the driving timing charts of FIGS. 8A and 8B resides in that the auxiliary electrode 129 is supplied with the electric potential Vc.

As illustrated in FIGS. 14A and 14B, the electric potential control unit 113 supplies the electric potential Vc to the auxiliary electrode 129 during all the periods.

When the photoelectric conversion operation is performed in one of the pixel electrodes 105A and 105B and the shutter operation is performed in the other pixel electrode, the electric potential is control in a manner that the collection of the charges generated in the photoelectric conversion layer 103 is facilitated to the pixel electrode 105 where the photoelectric conversion operation is performed. In other words, the electric potential control unit 108 controls the electric potential of the pixel electrode 105 in a manner that the charges are not moved to the pixel electrode 105 where the shutter operation is performed.

As a result, when the photoelectric conversion operation is performed in one of the pixel electrodes and the shutter operation is performed in the other pixel electrode, allocation of the signal charges generated in the photoelectric conversion layer 103 to the pixel electrode 105A and the pixel electrode 105B can be facilitated.

It should be noted that the configuration according to the present exemplary embodiment can be applied to all of the exemplary embodiments.

Fourth Exemplary Embodiment

Figure 15:
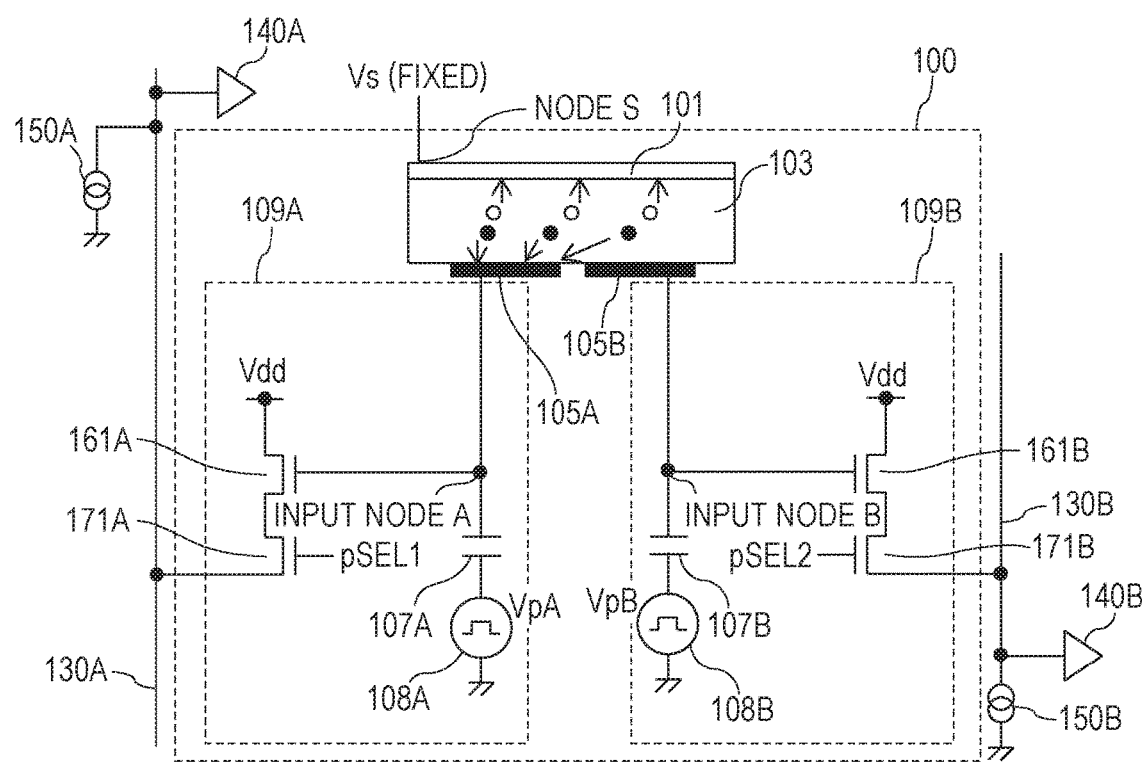
FIG. 15 is an equivalent circuit diagram of the pixel arranged in the photoelectric conversion apparatus.

The photoelectric conversion apparatus according to the present exemplary embodiment will be described with reference to FIG. 15 and FIGS. 16A and 16B. The photoelectric conversion apparatus according to the present exemplary embodiment can include the configuration illustrated in FIG. 1 and FIG. 3. Parts including functions similar to FIG. 1 to FIGS. 8A and 8B, FIG. 13, and FIGS. 14A and 14B are assigned with similar reference signs, and detailed descriptions thereof will be omitted.

Descriptions of the same parts as the first exemplary embodiment will be omitted. According to the present exemplary embodiment, the signal output circuit 109A and the signal output circuit 109B do not include the reset transistor 181A/181B of FIG. 2A. For this reason, the signal accumulation period starts when the photoelectric conversion unit reset operation of FIG. 5 is performed according to the present exemplary embodiment.

Figure 16B:
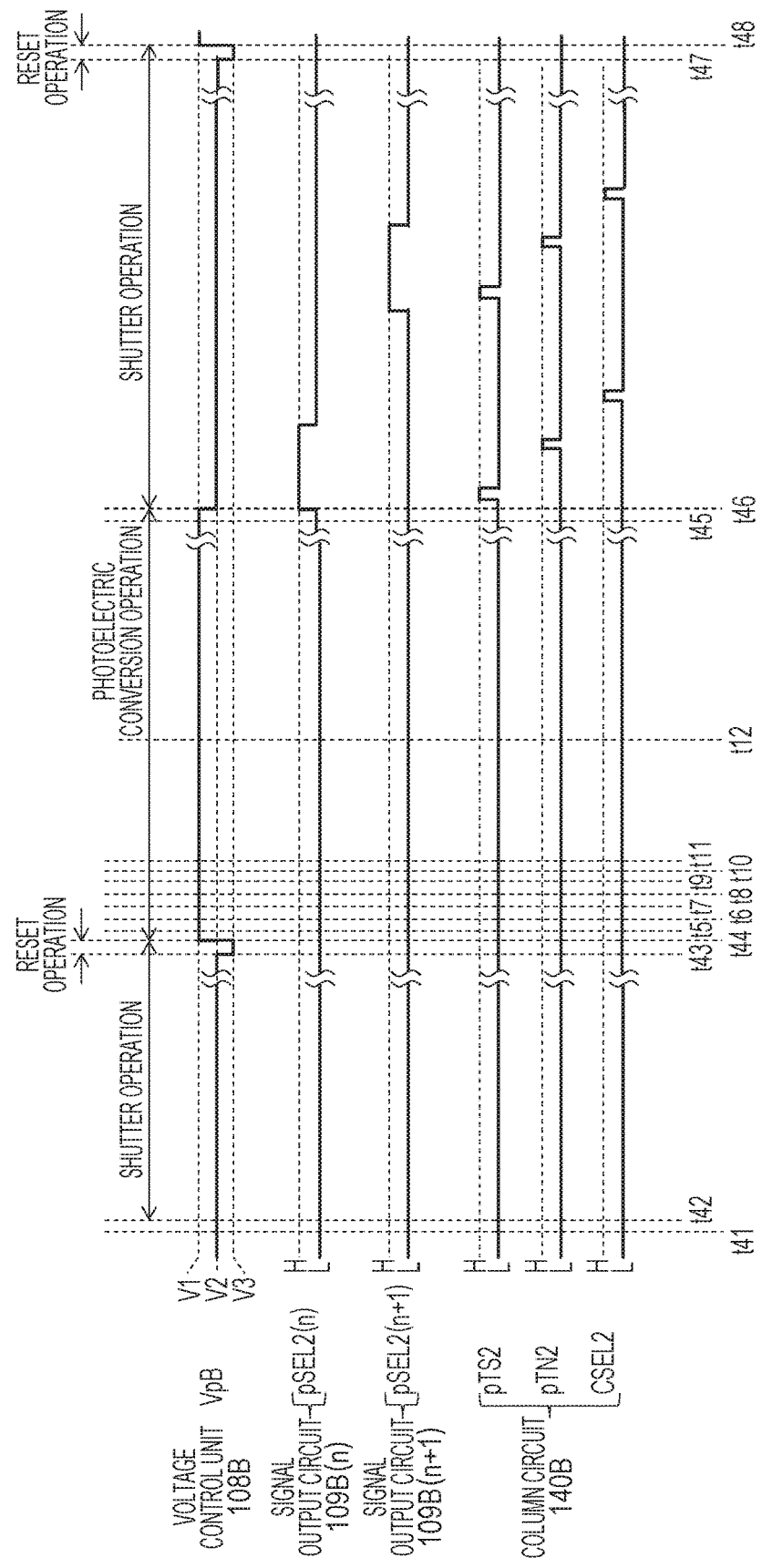

FIGS. 16A and 16B illustrate driving timings of the present exemplary embodiment. A period t41 to t42 and a period t45 to t46 in FIGS. 16A and 16B correspond to the period t1 to t2 and the period t13 to t14 in FIGS. 8A and 8B. A period t43 to t44 and a period t47 to t48 in FIGS. 16A and 16B correspond to the period t3 to t4 and the period t15 to t16 in FIGS. 8A and 8B.

Herein, the photoelectric conversion unit reset operation is performed by changing the electric potential VpA of the electric potential control unit 108A from the electric potential V2 to the electric potential V3 and changing the electric potential VpA from the electric potential V3 to the electric potential V1 during the period t41 to t42 and the period t45 to t46. As a result of the photoelectric conversion unit reset operation, the electric potentials of the photoelectric conversion layer 103 and the input node A are reset.

The photoelectric conversion unit reset operation is performed by changing the electric potential VpB of the electric potential control unit 108B from the electric potential V2 to the electric potential V3 and changing the electric potential VpB from the electric potential V3 to the electric potential V1 during the period t43 to t44 and the period t47 to t48. As a result of the photoelectric conversion unit reset operation, the electric potentials of the photoelectric conversion layer 103 and the input node B are reset.

The other operations are similar to those of FIGS. 8A and 8B.

As described above, in a case where the respective signal output circuits 109 do not include the reset transistor 181 as in the present exemplary embodiment, the reset operation of the input node of the amplification transistor 161 can be realized by using the photoelectric conversion unit reset operation of FIG. 5.

According to the configuration of the present exemplary embodiment, the area of the signal output circuit 109A/109B can be decreased since the reset transistor 181 is not arranged. In addition, reset noise (KTC noise) that may be generated in the reset operation by the reset transistor 181 can be suppressed.

Furthermore, the input node A/B of the amplification transistor 161 can be connected to the gate of the amplification transistor 161 without the intermediation of an impurity diffused part of the semiconductor substrate. The impurity diffused part tends to be a generation source of the dark current. It is possible to suppress an influence of the dark current that may be generated in an impurity diffused region.

As a result, it is possible to improve the S/N ratio according to the configuration of the present exemplary embodiment. The present configuration can be applied to all the exemplary embodiments except for the second exemplary embodiment.

Fifth Exemplary Embodiment

The photoelectric conversion apparatus according to the present exemplary embodiment will be described with reference to FIG. 17. FIG. 1, FIG. 3, FIG. 5, FIGS. 6A to 6C, and FIGS. 7A to 7E are similar to the first exemplary embodiment. Parts including functions similar to FIG. 1 to FIGS. 14A and 14B are assigned with similar reference signs, and detailed descriptions thereof will be omitted.

Figure 17:
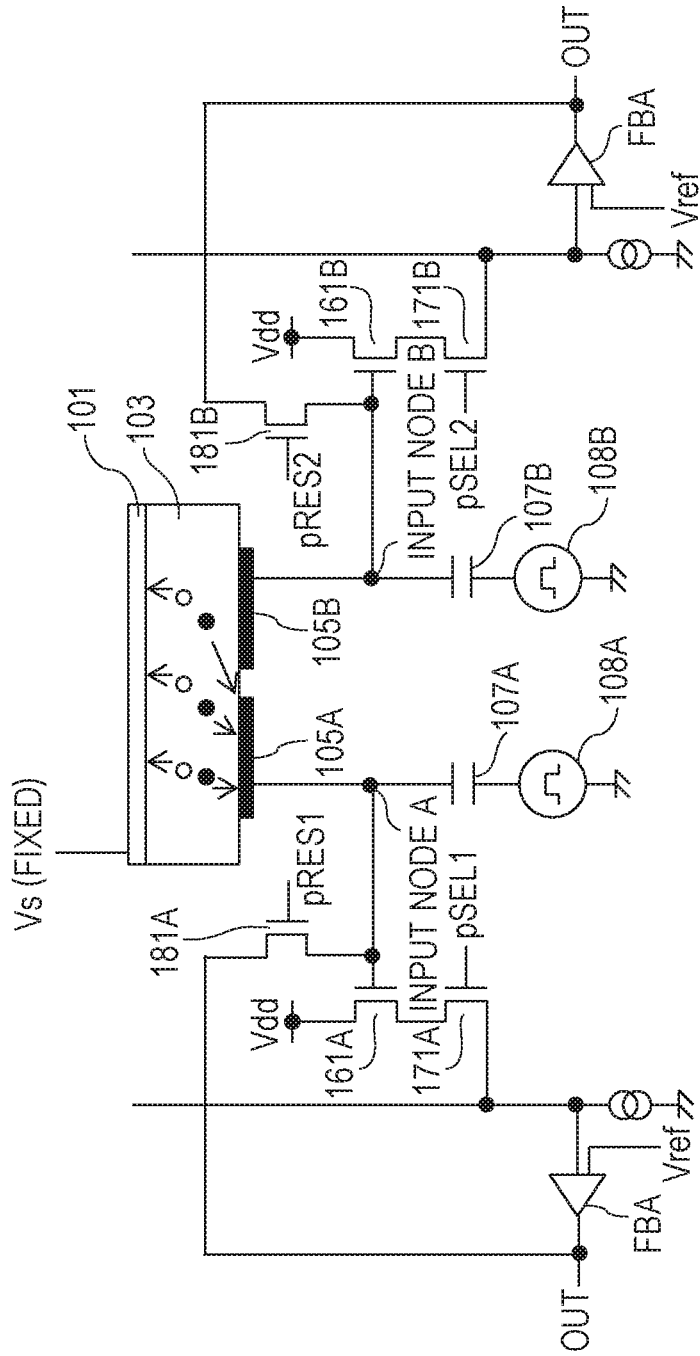
FIG. 17 is an equivalent circuit diagram of the pixel arranged in the photoelectric conversion apparatus.

FIG. 17 illustrates the configuration of the pixel 100 according to the present exemplary embodiment. With regard to the pixel 100 according to the present exemplary embodiment, a feedback circuit FBA is connected to a drain that is connected to the power supply voltage in the reset transistor 181. An output of the feedback circuit FBA is supplied to an input node of the column circuit 140 which is not illustrated in the drawing.

According to the configuration of FIG. 17, a reference voltage Vref of the feedback circuit FBA is supplied to a drain of the reset transistor 181. Subsequently, when the reset operation is performed, the feedback circuit FBA includes a function for feeding back the output as the reset electric potential.

According to the above-described configuration, it is possible to suppress the reset noise (KTC noise) that may be generated when the reset operation is performed by using the reset transistor 181 as illustrated in FIGS. 8A and 8B.

In addition, it is possible to improve the S/N ratio according to the configuration of the present exemplary embodiment. The present exemplary embodiment can be applied to all of the exemplary embodiments except for the fourth exemplary embodiment.

Sixth Exemplary Embodiment

Figure 18:
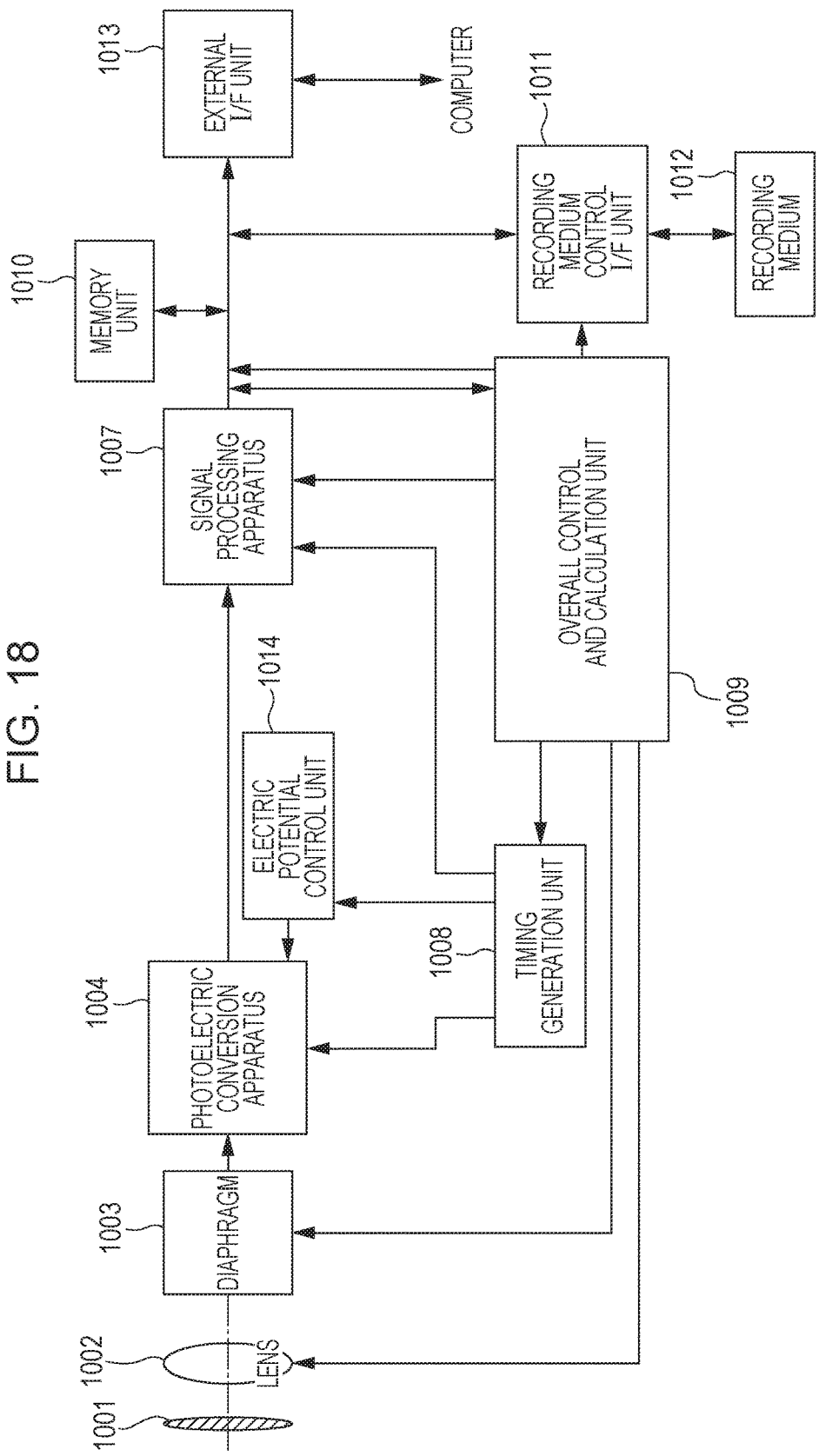
FIG. 18 is a block diagram of a photoelectric conversion system.

An image pickup system according to the present exemplary embodiment of the disclosure will be described. Examples of the image pickup system include a digital still camera, a digital camcorder, a camera head, a copier, a facsimile, a mobile phone, an in-vehicle camera, an observation satellite, and the like. FIG. 18 is a block diagram of the digital still camera as an example of the image pickup system.

FIG. 18 illustrates a barrier 1001 for lens protection, a lens 1002 for forming an optical image of an object on a photoelectric conversion apparatus 1004, and a diaphragm 1003 configured to set a variable amount of light that passes through the lens 1002. The photoelectric conversion apparatus 1004 described according to the respective exemplary embodiments converts the optical image formed by the lens 1002 as the image data. Herein, an analog-to-digital (AD) conversion unit is formed on the semiconductor substrate of the photoelectric conversion apparatus 1004. A signal processing apparatus 1007 performs various corrections on image pickup data output by the photoelectric conversion apparatus 1004 and compression of the data.

The pixel 100 is provided such that the photoelectric conversion unit 120A and the photoelectric conversion unit 120B correspond to the single micro lens in the photoelectric conversion apparatus 1004. Subsequently, the signal processing apparatus 1007 processes the signal based on the charges generated by the photoelectric conversion unit 120A and the signal based on the charges generated by the photoelectric conversion unit 120B. As a result, distance information from the photoelectric conversion apparatus 1004 to the object can be obtained.

It should be noted that distance information from the photoelectric conversion apparatus 1004 including the pixel in which the further more photoelectric conversion units are provided with respect to the single micro lens to the object may be obtained. In this case, the signal processing apparatus 1007 uses a signal based on charges generated by photoelectric conversion units corresponding to part of the plurality of photoelectric conversion units provided with respect to the single micro lens and a signal based on charges generated by the other part of the photoelectric conversion units. Alternatively, the signal based on the charges generated by the other part of the photoelectric conversion units may be obtained by subtracting the signal based on charges generated by the part of the photoelectric conversion units from a signal based on a sum of the charges generated by the plurality of photoelectric conversion units.

FIG. 18 illustrates a timing generation unit 1008 configured to output various timing signals to the photoelectric conversion apparatus 1004 and the signal processing apparatus 1007 and an overall control and calculation unit 1009 configured to control the entirety of the digital still camera.

An electric potential control unit 1014 performs control the power supplied to the photoelectric conversion apparatus 1004. A frame memory unit 1010 temporarily stores the image data. A recording medium control interface unit 1011 is used to perform recording or reading with respect to a recording medium. A detachable recording medium 1012 such as a semiconductor memory records or reads out image pickup data.

An external interface unit 1013 is used to communicate with an external computer or the like. Herein, a timing signal or the like may be input from the outside of the image pickup system. It is sufficient when the image pickup system includes at least the photoelectric conversion apparatus 1004 and the signal processing apparatus 1007 that processes the image pickup signal output from the photoelectric conversion apparatus 1004.

According to the present exemplary embodiment, the configuration has been described where the photoelectric conversion apparatus 1004 and the AD conversion unit are arranged on the different semiconductor substrates. However, the photoelectric conversion apparatus 1004 and the AD conversion unit may be formed on the same semiconductor substrate. In addition, the photoelectric conversion apparatus 1004 and the signal processing apparatus 1007 may be formed on the same semiconductor substrate.

When the respective exemplary embodiments of the disclosure are applied to a photoelectric conversion system, it is possible to obtain the image where the noise is reduced.

According to the exemplary embodiments of the disclosure, it is possible to use the optical signal generated on the photoelectric conversion layer during the period in which the signal is output from the pixel.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-233213 filed Nov. 30, 2016, which is hereby incorporated by reference herein in its entirety.

What is claimed is:

1. A photoelectric conversion apparatus comprising:
   a plurality of pixels, each pixel including
   a pixel electrode having a first electrode and a second electrode on an upper part of a substrate,
   an upper electrode arranged on an upper part of the pixel electrode,
   a photoelectric conversion layer arranged between the pixel electrode and the upper electrode,
   a first signal output circuit including a first amplification unit having an input node directly connected to the first electrode, and
   a second signal output circuit including a second amplification unit having an input node directly connected to the second electrode; and
   a control unit configured to supply an electric potential to the second electrode that a potential of the second electrode with respect to signal charges decreases as compared with a potential of the first electrode with respect to signal charges in an electric potential supplied to the first electrode during a first period in which the first signal output circuit outputs a signal.

2. The photoelectric conversion apparatus according to claim 1, wherein an electric potential is supplied to the first electrode that a potential with respect to signal charges decreases as compared with a potential with respect to signal charges in an electric potential supplied to the second electrode during a second period in which the second signal output circuit outputs a signal.

3. The photoelectric conversion apparatus according to claim 2, wherein the first period and the second period are alternately repeated.

4. The photoelectric conversion apparatus according to claim 2, further comprising:
a first control unit including a first drive capacitance connected to the input node directly connected to the first electrode and a first electric potential control unit configured to control the electric potential of the first electrode via the first drive capacitance; and
a second control unit including a second drive capacitance connected to the input node directly connected to the second electrode and a second electric potential control unit configured to control the electric potential of the second electrode via the second drive capacitance,
wherein the first electric potential control unit supplies a first electric potential corresponding to an electric potential at which the signal charges are collected to the first electrode, and the second electric potential control unit supplies a second electric potential corresponding to an electric potential with which a change in the electric potential of the input node is suppressed and which is different from the first electric potential to the second electrode during the second period.

5. The photoelectric conversion apparatus according to claim 4, wherein the second electric potential control unit supplies the first electric potential to the second electrode, and the first electric potential control unit supplies the second electric potential to the first electrode during the first period.

6. The photoelectric conversion apparatus according to claim 4,
wherein the first electric potential control unit supplies a third electric potential for resetting the signal charges in the photoelectric conversion layer to the first electrode before the collection of the signal charges starts in the first electrode, and
wherein the second electric potential control unit supplies the third electric potential to the second electrode before the collection of the signal charges starts in the second electrode.

7. The photoelectric conversion apparatus according to claim 6, further comprising an insulation layer arranged between the photoelectric conversion layer and the first electrode and between the photoelectric conversion layer and the second electrode.

8. The photoelectric conversion apparatus according to claim 2, wherein, during a third period preceding the first period, the first electrode performs collection of the signal charges corresponding to the signal to be output from the first signal output circuit during the first period, and the second electrode does not perform collection of the signal charges and output of the signal from the second signal output circuit.

9. The photoelectric conversion apparatus according to claim 8, further comprising:

a first control unit including a first drive capacitance connected to the input node directly connected to the first electrode and a first electric potential control unit configured to control the electric potential of the first electrode via the first drive capacitance; and
a second control unit including a second drive capacitance connected to the input node directly connected to the second electrode and a second electric potential control unit configured to control the electric potential of the second electrode via the second drive capacitance,
wherein the second electric potential control unit supplies a first electric potential corresponding to an electric potential at which the signal charges are collected to the second electrode, and the first electric potential control unit supplies a second electric potential corresponding to an electric potential with which a change in the electric potential of the input node is suppressed and which is different from the first electric potential to the first electrode during the first period,
wherein the first electric potential control unit supplies the first electric potential to the first electrode, and the second electric potential control unit supplies the second electric potential to the second electrode during the second period, and
wherein the first electric potential control unit supplies the first electric potential to the first electrode, and the second electric potential control unit supplies the second electric potential to the second electrode during the third period.

10. The photoelectric conversion apparatus according to claim 1,
wherein the control unit includes a first control unit and a second control unit,
wherein the first control unit includes a first drive capacitance connected to the input node directly connected to the first electrode and a first electric potential control unit configured to control the electric potential of the first electrode via the first drive capacitance,
wherein the second control unit includes a second drive capacitance connected to the input node directly connected to the second electrode and a second electric potential control unit configured to control the electric potential of the second electrode via the second drive capacitance, and
wherein the second electric potential control unit supplies a first electric potential corresponding to an electric potential at which the signal charges are collected to the second electrode, and the first electric potential control unit supplies a second electric potential corresponding to an electric potential with which a change in the electric potential of the input node is suppressed and which is different from the first electric potential to the first electrode during the first period.

11. The photoelectric conversion apparatus according to claim 1,
wherein the first signal output circuit includes a first reset transistor configured to set an electric potential of the input node directly connected to the first electrode as a reset electric potential,
wherein the second signal output circuit includes a second reset transistor configured to set an electric potential of the input node directly connected to the second electrode as a reset electric potential, and
wherein the electric potential of the input node directly connected to the first electrode is set as the reset electric potential before collection of the signal charges starts in the first electrode, and the electric potential of the input node directly connected to the second electrode is set as the reset electric potential before collection of the signal charges starts in the second electrode.

12. The photoelectric conversion apparatus according to claim 11, further comprising:
a first feedback circuit to which the signal output from the first signal output circuit is input and which includes an output node connected to a drain of the first reset transistor; and
a second feedback circuit to which the signal output from the second signal output circuit is input and which includes an output node connected to a drain of the second reset transistor.

13. The photoelectric conversion apparatus according to claim 1, wherein start of collection of the signal charges in the first electrode and end of the collection of the signal charges in the first electrode are simultaneously performed, and start of collection of the signal charges in the second electrode and end of the collection of the signal charges in the second electrode are simultaneously performed in all of the plurality of pixels.

14. The photoelectric conversion apparatus according to claim 1, further comprising:
a third electrode arranged between the first electrode and the second electrode,
the photoelectric conversion layer being arranged between the upper electrode and the third electrode; and
a third electric potential control unit which is configured to control an electric potential of the third electrode and is connected to the third electrode.

15. A photoelectric conversion system comprising:
the photoelectric conversion apparatus according to claim 1; and
a signal processing apparatus configured to process a signal output from the photoelectric conversion apparatus.

16. The photoelectric conversion system according to claim 15, further comprising:
a plurality of pixels, each pixel including the first electrode, the second electrode, and the photoelectric conversion layer; and
a single macro lens corresponding to the first electrode and the second electrode,
wherein distance information of an object is obtained by using the signal output from the first signal output circuit and the signal output from the second signal output circuit.

17. A photoelectric conversion apparatus comprising:
a plurality of pixels, each pixel including
a pixel electrode having a first electrode and a second electrode on an upper part of a substrate,
an upper electrode on an upper part of the pixel electrode,
a photoelectric conversion layer arranged between the pixel electrode and the upper electrode,
a first signal output circuit connected to the first electrode, and
a second signal output circuit connected to the second electrode,
wherein each of the first electrode and the second electrode is configured to implement a first mode for collecting signal charges, and a second mode for collecting fewer signal charges than the signal charges in the first mode, and
wherein the first electrode implements the second mode, and the second electrode implements the first mode during a first period in which the first signal output circuit outputs a signal.

18. The photoelectric conversion apparatus according to claim 17,
wherein the second electrode is put into the second mode, and the first electrode is put into the first mode during a second period in which the second signal output circuit outputs a signal, and
wherein the first period and the second period are alternately implemented.

19. A photoelectric conversion system comprising:
the photoelectric conversion apparatus according to claim 17; and
a signal processing apparatus configured to process a signal output from the photoelectric conversion apparatus.

20. The photoelectric conversion system according to claim 19, further comprising:
a plurality of pixels, each pixel including the first electrode, the second electrode, and the photoelectric conversion layer; and
a single macro lens corresponding to the first electrode and the second electrode,
wherein distance information of an object is obtained by using the signal output from the first signal output circuit and the signal output from the second signal output circuit.

* * * * *